United States Patent
Miyamoto et al.

(10) Patent No.: US 9,711,532 B2
(45) Date of Patent: Jul. 18, 2017

(54) THREE DIMENSIONAL NAND MEMORY HAVING IMPROVED CONNECTION BETWEEN SOURCE LINE AND IN-HOLE CHANNEL MATERIAL AS WELL AS REDUCED DAMAGE TO IN-HOLE LAYERS

(71) Applicant: SanDisk Technologies LLC, Plano, TX (US)

(72) Inventors: Masato Miyamoto, Yokkaichi (JP); Yuji Fukano, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/292,898

(22) Filed: Oct. 13, 2016

(65) Prior Publication Data
US 2017/0033121 A1 Feb. 2, 2017

Related U.S. Application Data

(62) Division of application No. 14/579,608, filed on Dec. 22, 2014, now Pat. No. 9,530,781.

(51) Int. Cl.
*H01L 29/76* (2006.01)
*H01L 29/792* (2006.01)
(Continued)

(52) U.S. Cl.
CPC .. *H01L 27/11582* (2013.01); *H01L 21/28273* (2013.01); *H01L 21/28282* (2013.01);
(Continued)

(58) Field of Classification Search
CPC ......... H01L 27/11582; H01L 21/28273; H01L 21/28282; H01L 21/76895; H01L 23/528; H01L 27/11556; H01L 29/0847
(Continued)

(56) References Cited

U.S. PATENT DOCUMENTS

2005/0063237 A1\* 3/2005 Masuoka .............. H01L 27/115
365/222
2006/0091556 A1\* 5/2006 Shigeoka ............ H01L 21/8221
257/773

(Continued)

OTHER PUBLICATIONS

Requirement for Restriction/Election mailed Oct. 22, 2015 in U.S. Appl. No. 14/579,608.
(Continued)

*Primary Examiner* — Dzung Tran
(74) *Attorney, Agent, or Firm* — Vierra Magen Marcus LLP

(57) ABSTRACT

A fabrication process is provided for a 3D stacked nonvolatile memory device which provides a source contact to a bottom of a memory hole in a stack without exposing a programmable material lining of an interior sidewall of the memory hole and without exposing a channel forming region also lining an interior of the memory hole to an energetic and potentially damaging etch environment. The stack includes alternating control gate layers and dielectric layers on a substrate, and the memory hole is etched through the stack before lining an interior sidewall thereof with the programmable material and then with the channel forming material. The process avoids a need to energetically etch down through the memory hole to open up a source contact hole near the bottom of the channel forming material by instead etching upwardly from beneath the memory hole.

16 Claims, 17 Drawing Sheets

(51) Int. Cl.
  *H01L 27/11582* (2017.01)
  *H01L 27/11524* (2017.01)
  *H01L 27/11556* (2017.01)
  *H01L 27/1157* (2017.01)
  *H01L 29/49* (2006.01)
  *H01L 21/285* (2006.01)
  *H01L 21/311* (2006.01)
  *H01L 21/28* (2006.01)
  *H01L 21/768* (2006.01)
  *H01L 23/528* (2006.01)
  *H01L 29/08* (2006.01)

(52) U.S. Cl.
  CPC .. *H01L 21/28568* (2013.01); *H01L 21/31111* (2013.01); *H01L 21/76895* (2013.01); *H01L 23/528* (2013.01); *H01L 27/1157* (2013.01); *H01L 27/11524* (2013.01); *H01L 27/11556* (2013.01); *H01L 29/0847* (2013.01); *H01L 29/495* (2013.01)

(58) Field of Classification Search
  USPC .................................................. 257/314, 324
  See application file for complete search history.

(56) References Cited

U.S. PATENT DOCUMENTS

| | | |
|---|---|---|
| 2007/0158736 A1 | 7/2007 | Arai |
| 2007/0252201 A1 | 11/2007 | Kito |
| 2008/0173928 A1 | 7/2008 | Arai |
| 2008/0242025 A1* | 10/2008 | Kim ...................... H01L 27/115 438/262 |
| 2010/0078701 A1 | 4/2010 | Shim |
| 2010/0213537 A1* | 8/2010 | Fukuzumi ......... H01L 27/11578 257/326 |
| 2010/0309729 A1 | 12/2010 | Chang |
| 2011/0002178 A1* | 1/2011 | Hwang ............. H01L 27/11578 365/189.011 |
| 2011/0249498 A1 | 10/2011 | Tokiwa |
| 2012/0001249 A1* | 1/2012 | Alsmeier .......... H01L 27/11551 257/319 |
| 2012/0147644 A1 | 6/2012 | Scheuerlein |

OTHER PUBLICATIONS

Response to Election/Restriction mailed Nov. 24, 2015 in U.S. Appl. No. 14/579,608.
Non-Final Rejection mailed Feb. 25, 2016 in U.S. Appl. No. 14/579,608.
Amendment mailed May 5, 2016 in U.S. Appl. No. 14/579,608.
Notice of Allowance and Fees Due mailed Jul. 26, 2016 in U.S. Appl. No. 14/579,608.

* cited by examiner

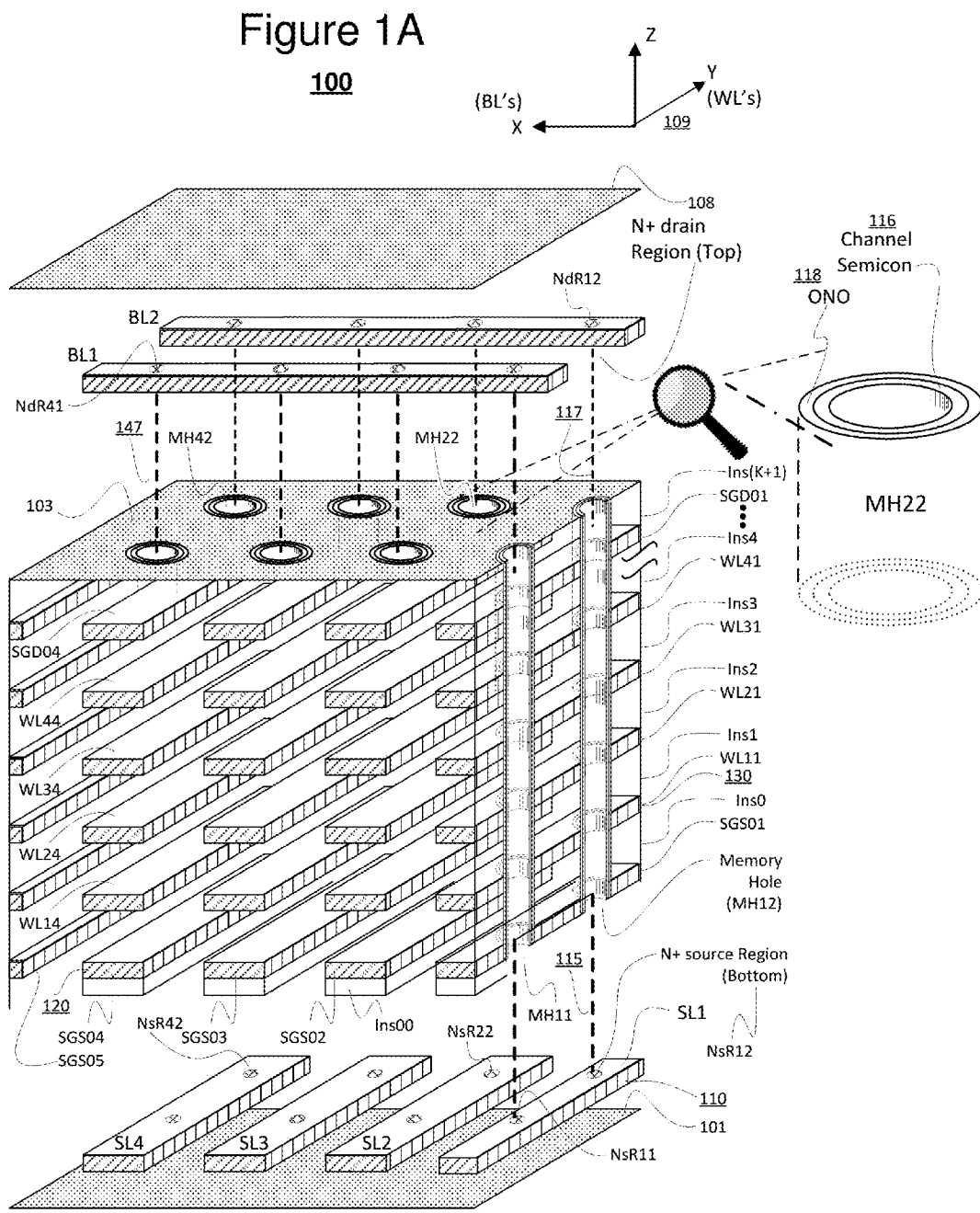

100'

200

201

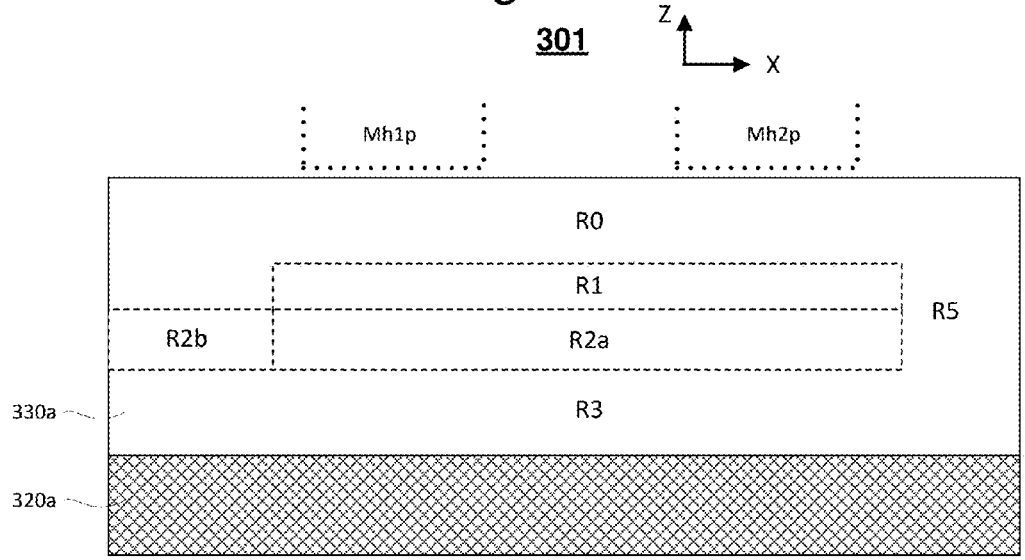
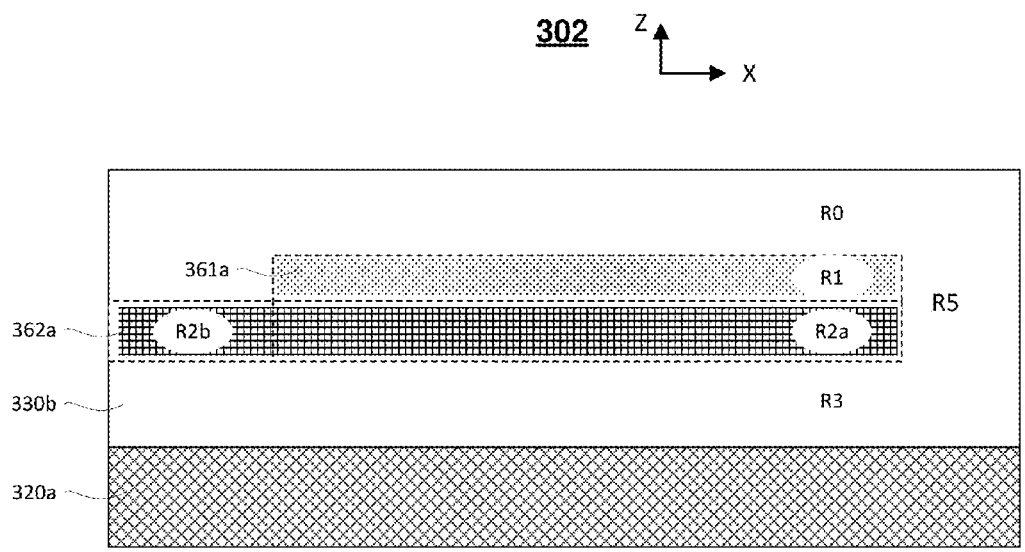

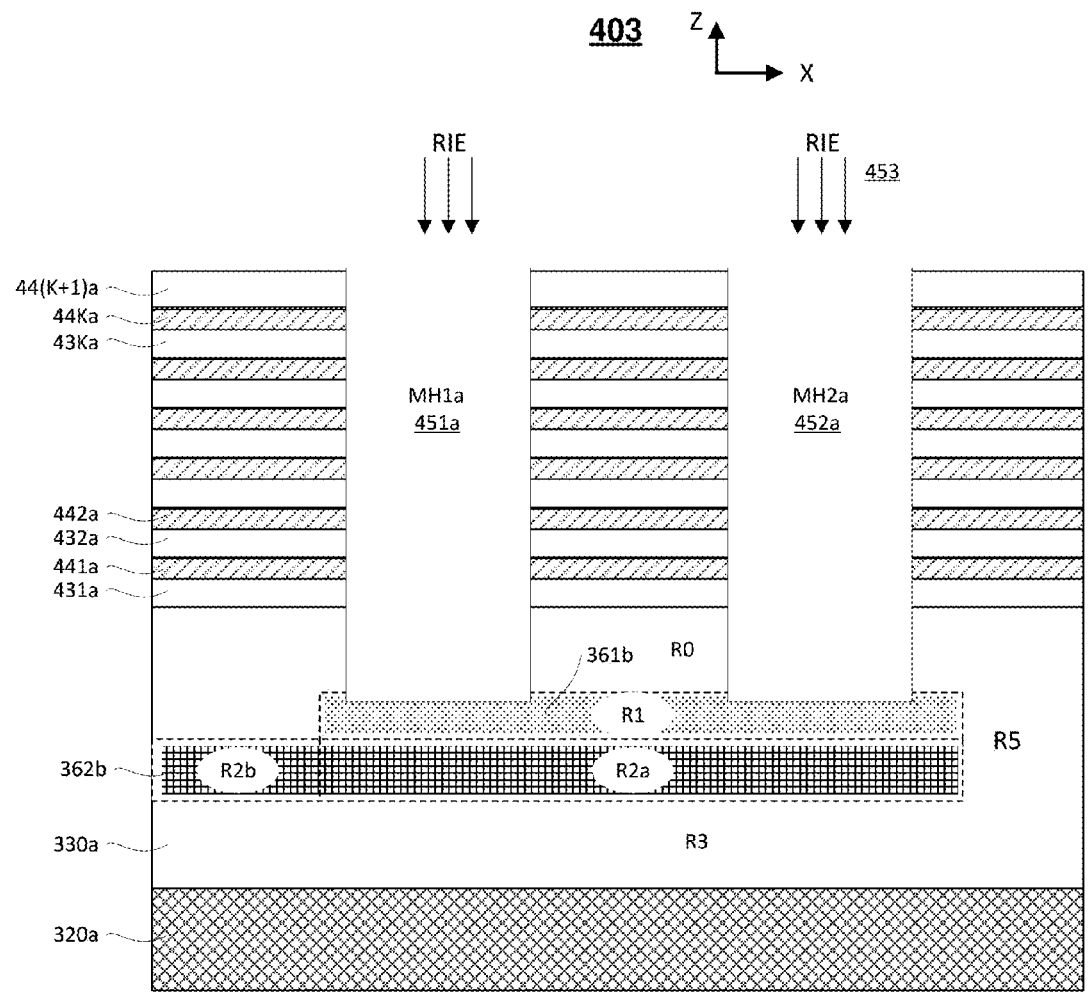

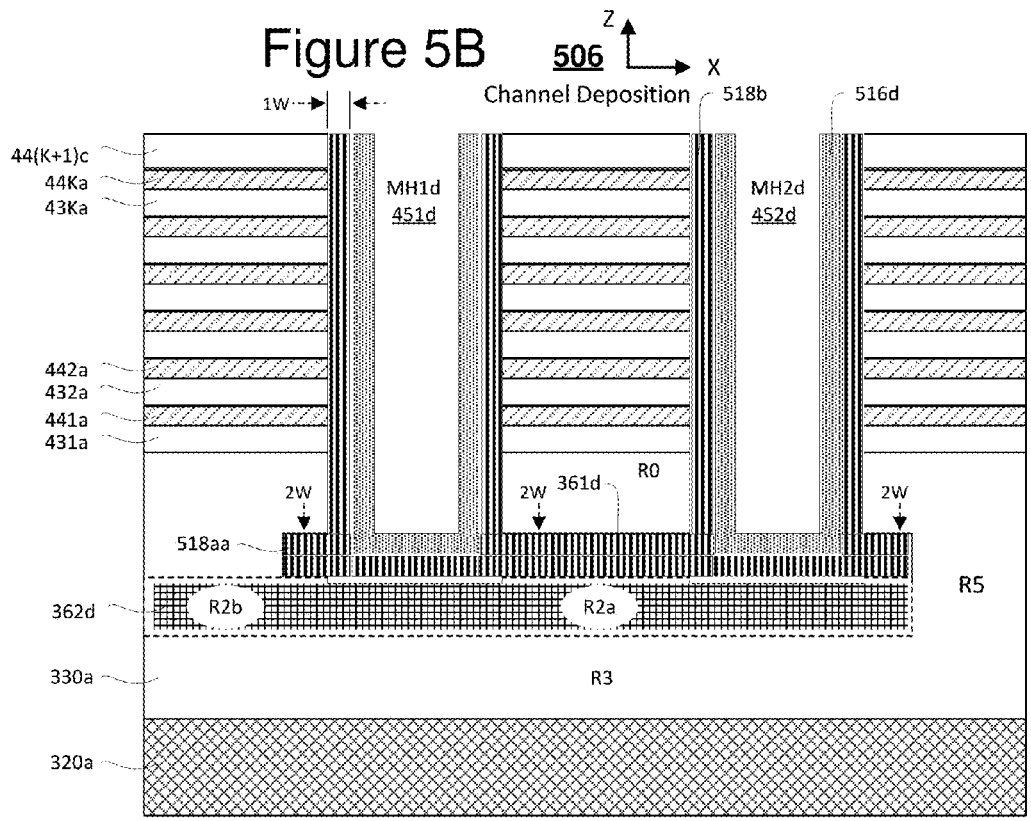
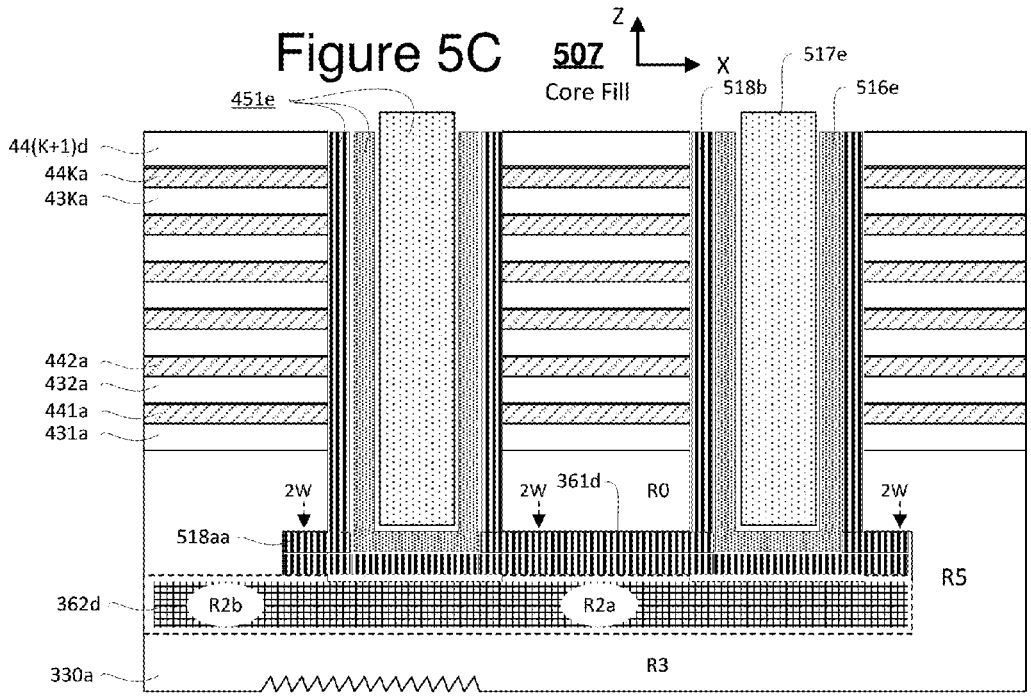

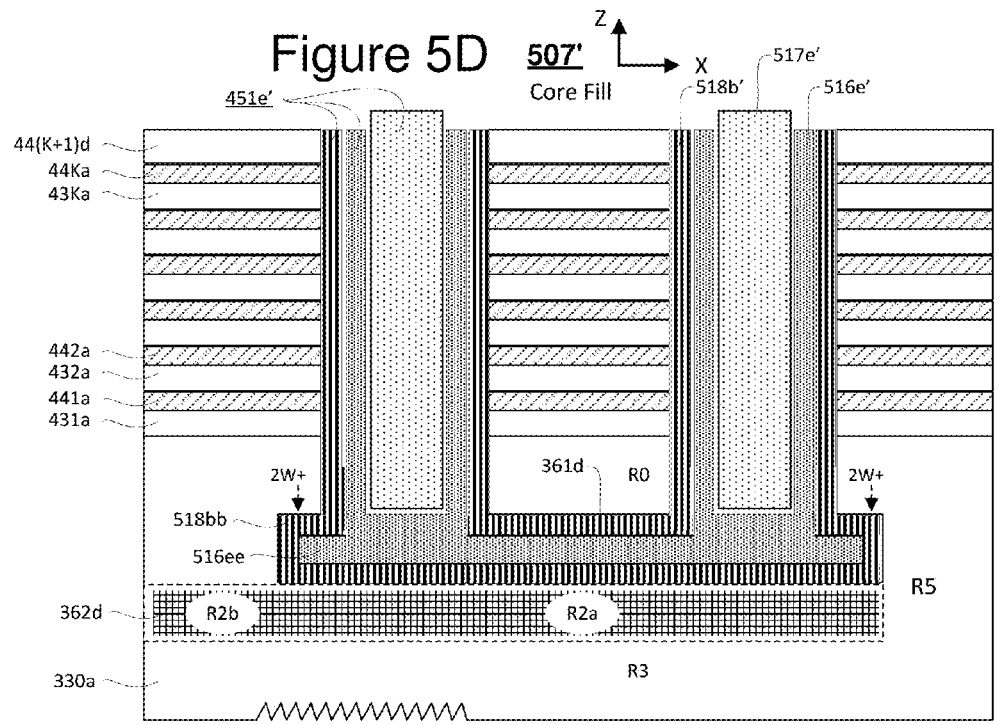
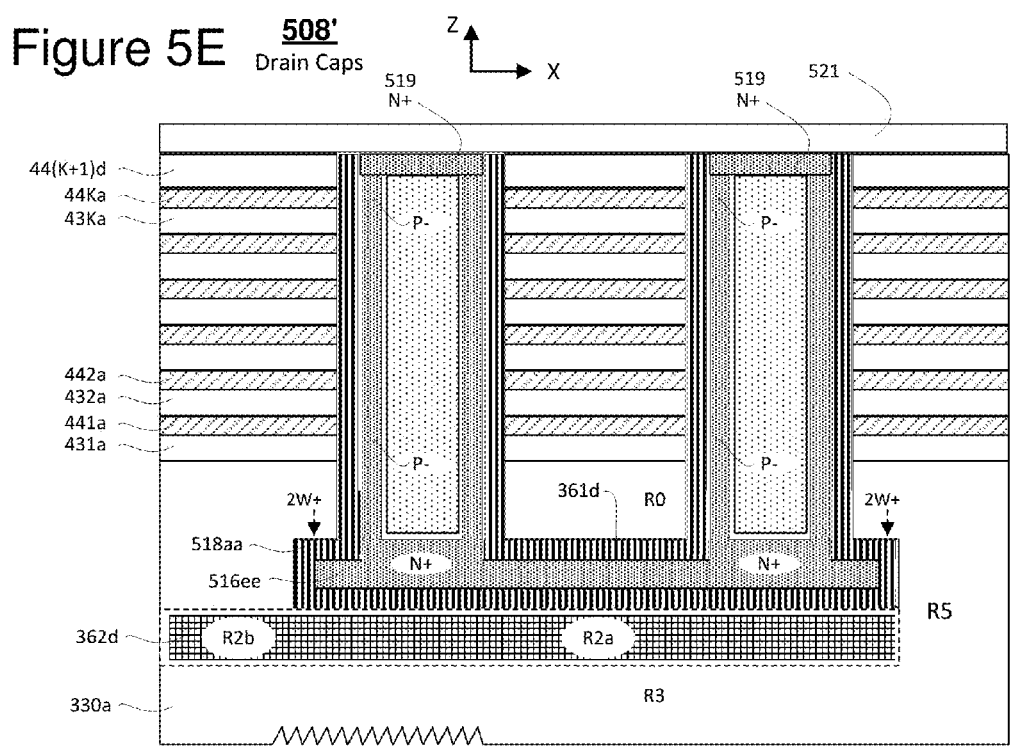

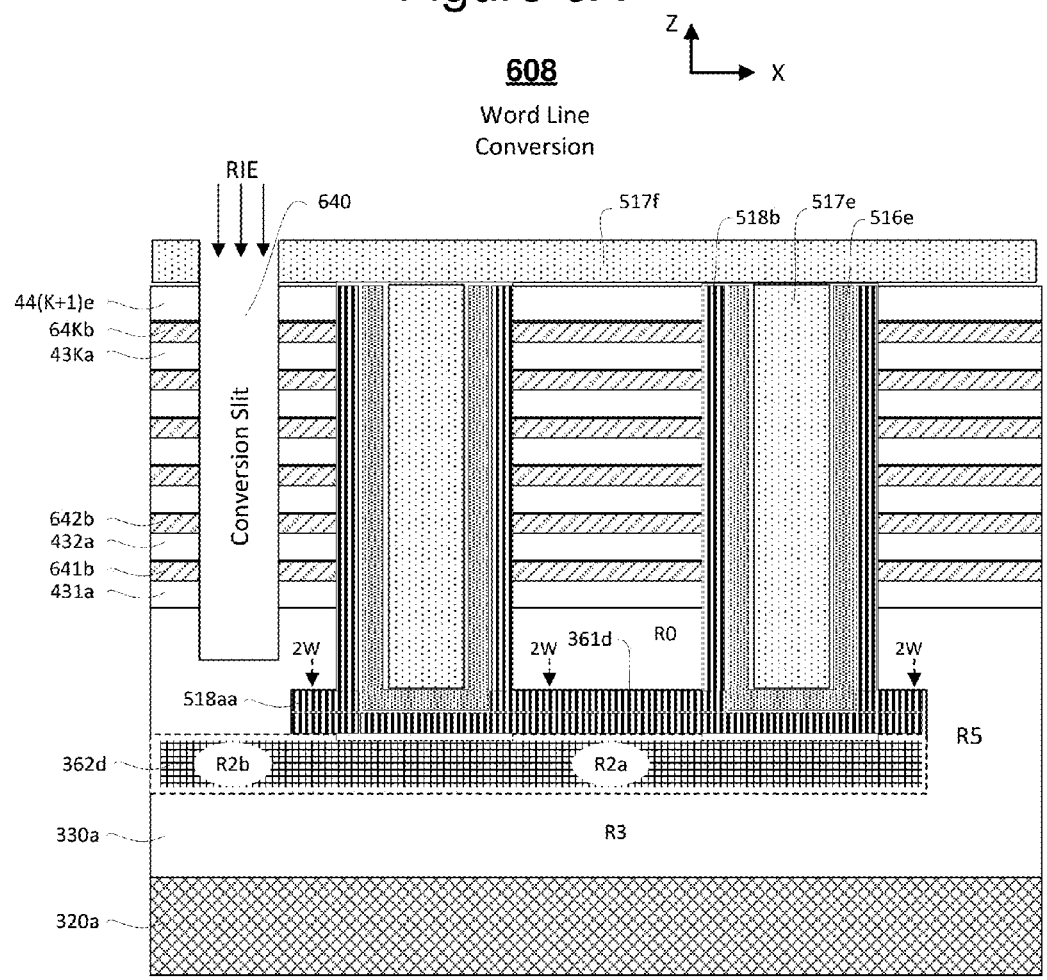

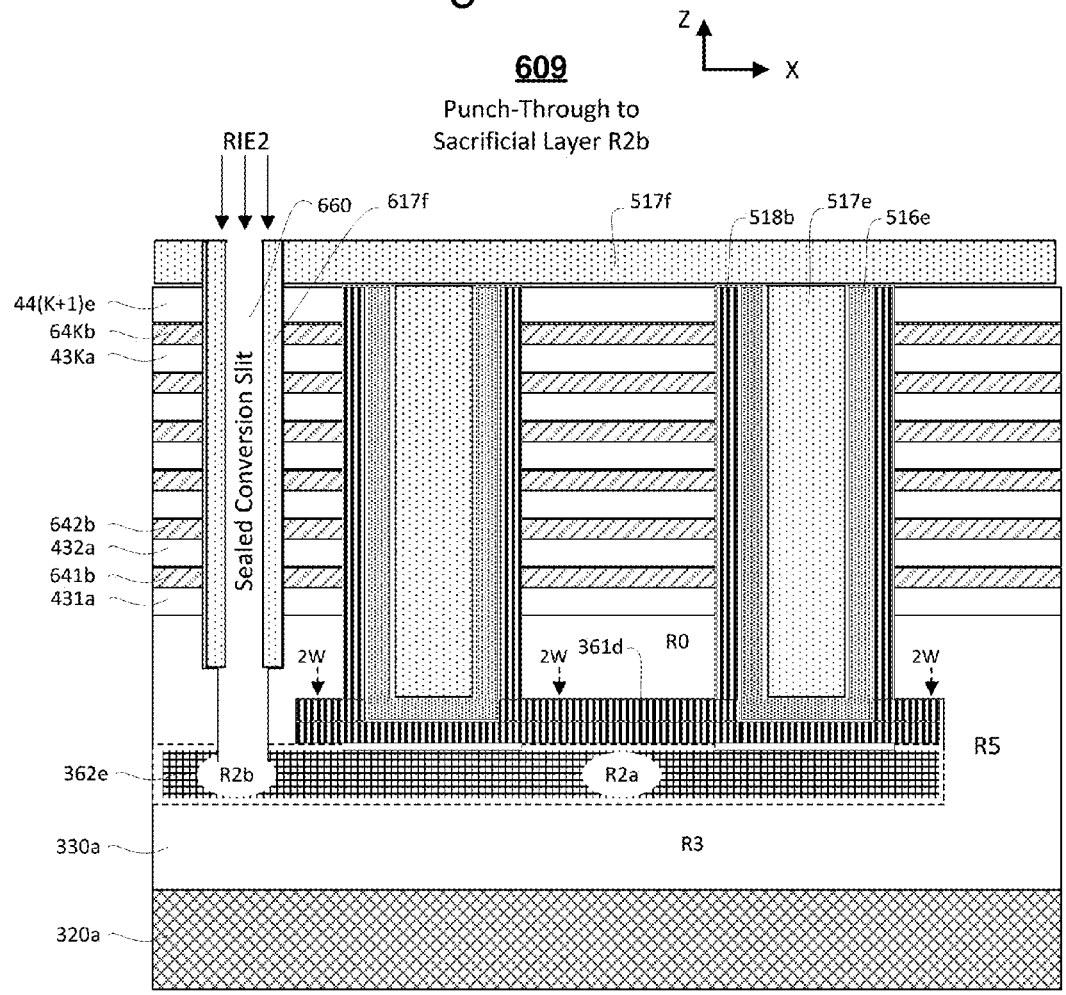

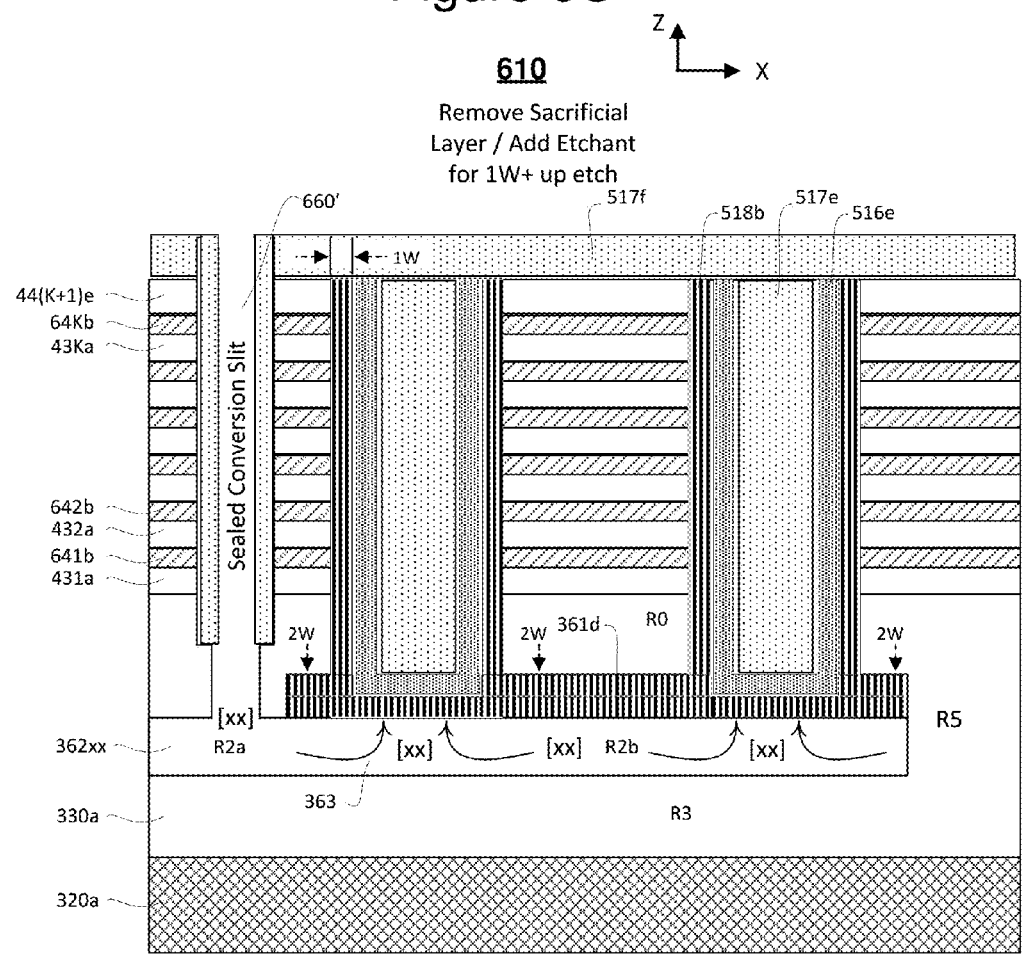

611

Finish 1W+ upward etch

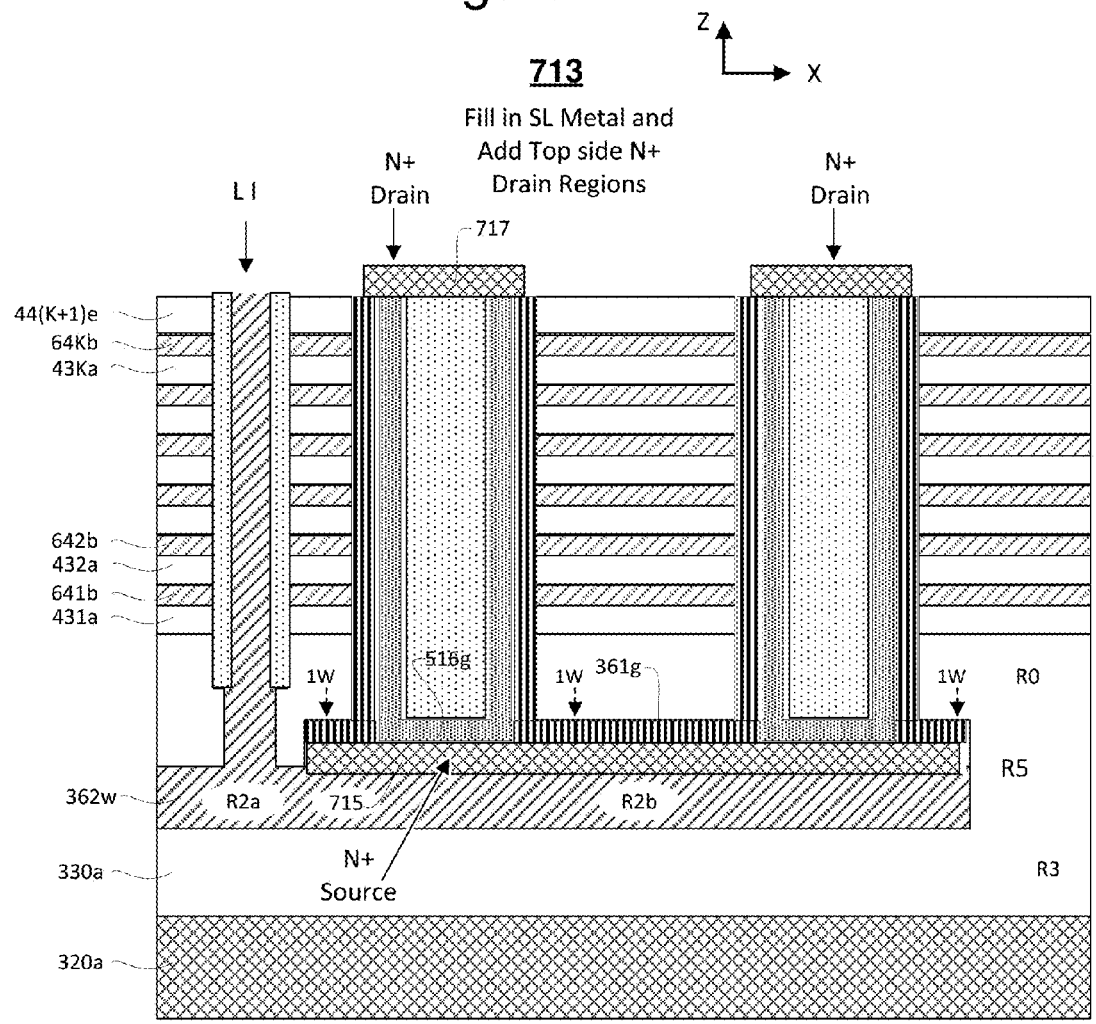

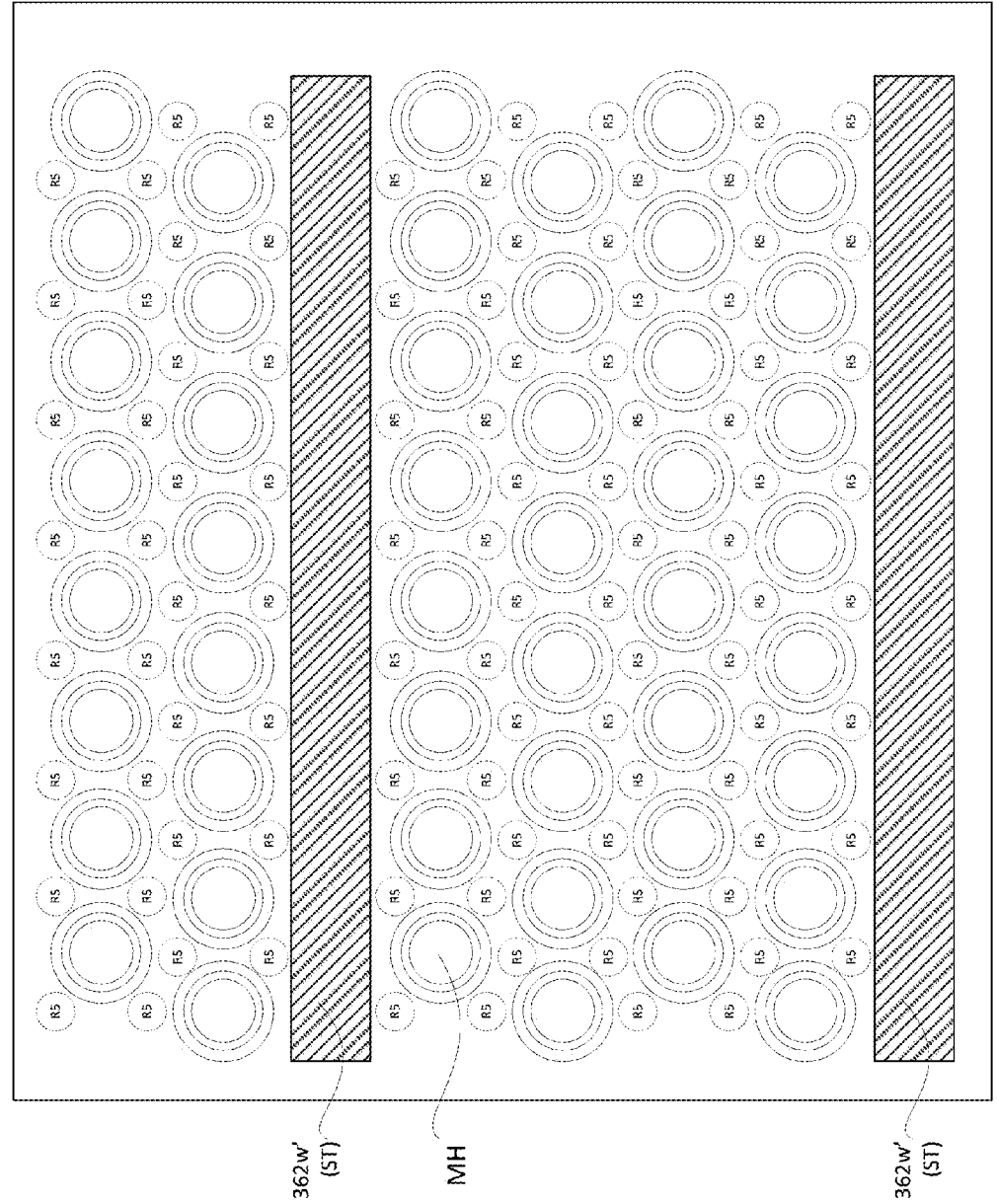

900

THREE DIMENSIONAL NAND MEMORY HAVING IMPROVED CONNECTION BETWEEN SOURCE LINE AND IN-HOLE CHANNEL MATERIAL AS WELL AS REDUCED DAMAGE TO IN-HOLE LAYERS

CROSS REFERENCE TO RELATED APPLICATION

This application is a divisional of and claims benefit of U.S. patent application Ser. No. 14/579,608 filed Dec. 22, 2014, which is incorporated by referencing herein in its entirety for all purposes.

BACKGROUND

The here disclosed technology relates to techniques for fabricating a 3D non-volatile memory device whose memory elements include an ONO or like charge storage structure.

Recently, ultra-high density storage devices have been proposed using three-dimensionally (3D) stacked memory structures. One example is referred to as a Bit Cost Scalable (BiCS) architecture. In one embodiment, a stacked and alternating array of conductive layers and dielectric layers is provided. A memory hole (MH) is formed by etching down through the layers to define a large number of memory layers simultaneously. A NAND connected string of memory elements is then formed by filling the sidewall and core of the memory hole with appropriate materials. A straight down NAND string may be formed by providing source and drain contacts at the top and bottom of the filled memory hole. Alternatively, a U-shaped or otherwise snaked NAND connected string of memory elements (P-BiCS) may be formed so as to includes adjacent pairs of memory holes, each having a vertical column of memory cells, where the strings are connected at their bottoms by way of a bottom-side back gate. Source and drain contacts are made at the top of the P-BiCS structure. Control gates of the respective memory cells are respectively provided by the stacked conductive layers. However, various challenges are presented in fabricating such memory devices.

BRIEF DESCRIPTION OF THE DRAWINGS

Like-numbered elements refer to common components in the different figures.

FIG. 1A is a perspective and partially exploded apart view of a 3D stacked non-volatile memory device.

FIG. 3A schematically depicts a subdividing of a bulk dielectric body at least into first and second regions.

FIG. 3B schematically depicts forming filled and respective first and second cavities in the first and second regions of the bulk dielectric body, the first and second cavities being filled with respective and different first and second sacrificial materials.

FIG. 4A schematically depicts forming a stack of alternating layers on the bulk dielectric body and boring a memory hole down into the first sacrificial material of the first region.

FIG. 5B schematically depicts adding the channel material.

FIG. 5C schematically depicts adding a bore core dielectric material.

FIG. 5D schematically depicts a variation on the channel material adding step of FIG. 5B and on the preceding material deposition step of FIG. 5A.

FIG. 5E schematically depicts an embodiment where drain caps are added prior to formation of a source contact trench.

FIG. 6A schematically depicts forming a control gate conversion trench.

FIG. 6B schematically depicts a sealing of the control gate conversion trench and a forming of a vertical shaft extending into the second sacrificial material of the second region.

FIG. 6C schematically depicts a selective removing of the second sacrificial material of the second region and use of the formed conduit to subject exposed bottoms of the channel material an etching.

FIG. 7B schematically depicts a depositing of metallization onto the source region-forming material.

FIG. 8 schematically depicts a top plan view of one embodiment of the 3D stacked non-volatile memory device where memory holes are closely packed.

DETAILED DESCRIPTION

Figure 1B:
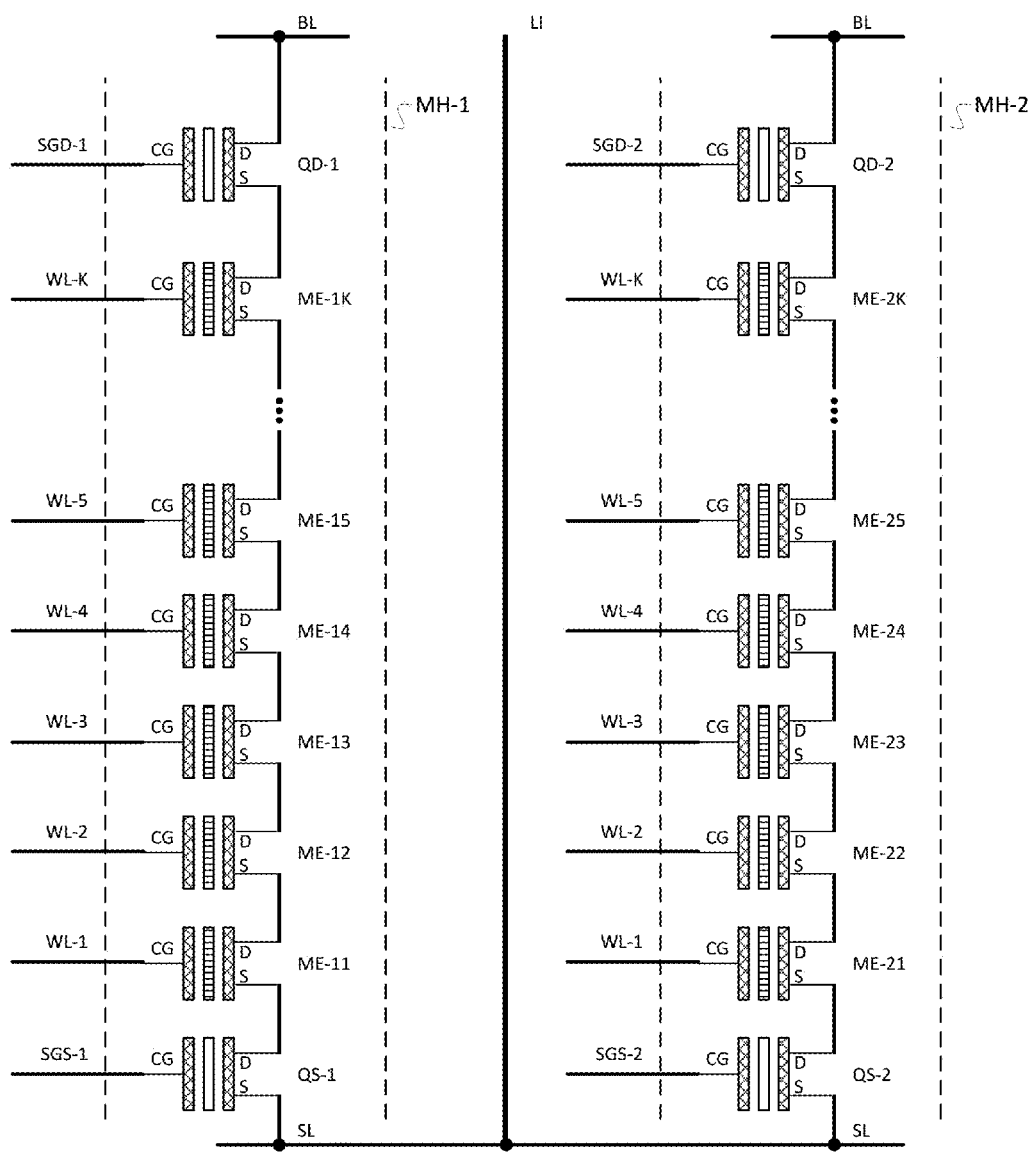
FIG. 1B is a schematic diagram showing a configuration of memory holes in one embodiment.

Fabrication processes are provided herein for 3D (three-dimensional) stacked non-volatile memory devices where the processes create source contacts at bottoms of memory holes without subjecting interior linings of the memory holes to a potentially damaging through-etch. The source contacts are created with a bottom-up etch process rather than with a potentially damaging from-the-top through-etch. A corresponding 3D stacked non-volatile memory device that is substantially free of damage to the interior linings of its memory holes is also provided.

Typically, a 3D memory stack includes alternating horizontal layers of control gate material and dielectric material. Programmable charge storage films line the interiors of memory holes that extend vertically through the stack. For example, a film stack of respective oxide-nitride-oxide sublayers (ONO) may be used as a re-programmable charge storage film and a film of undoped or lightly doped polysilicon can be deposited along the interior sidewall of the ONO film. The more interior, polysilicon film serves a shared channel-defining layer for a formed plurality of insulated gate field effect devices that are connected as a NAND type series of memory elements. Typically, a "drain side" pass transistor (QD, see briefly FIG. 1B) is provided at the top of the vertically extending NAND series of memory elements for selectively coupling the NAND string to an overlying bit line (BL). Similarly, a "source side" pass transistor (QS, see briefly FIG. 1B) is provided at the bottom of the vertically extending NAND series of memory elements for selectively coupling the NAND string to an underlying source line (SL). Heavily doped source and drain regions are respectively and typically formed at the tops and bottoms of the memory holes for ohmicly connecting respectively to the underlying source line (SL and the overlying bit line (BL).

During mass production fabrication, the stack of alternating layers for dielectric and gate control are formed first and then the initial holes which become memory holes are bored (e.g., anisotropically etched) down through the stack to accommodate the respective NAND strings of memory elements (and also typically, the source and drain side pass transistors, QS and QD). Coupling of the bottom of each memory hole to its respective source line (SL) occurs after the interiors of the memory holes are lined first with the re-programmable charge storage film and then with the channel forming film. In this latter case, challenges are presented in forming a good source contact at the bottom of each memory hole. One solution is to etch in a top down manner through the memory hole so as to create an opening in the bottom of the memory hole after depositing the charge storage film (e.g., ONO film) and then the channel forming film (e.g., undoped polysilicon). Subsequently, heavily doped semiconductor material may be formed at the bottom of the memory hole for connecting the channel film to an underlying source line (SL). However, such down etching through the memory hole is difficult due to the high aspect ratio of the memory hole. It can cause damage to the films (e.g., ONO and poly films) pre-lined along the inner surfaces of the memory hole. Moreover, the contact which the channel film makes with the lastly formed source region (the heavily doped; (e.g., N+ poly) semiconductor material) may have a relatively high resistance.

Techniques provided herein avoid the need to etch in a top-down manner through films at the bottom of a memory hole. Instead, a lateral conduit path is formed under the bottom of the memory hole to allow for a from-bottom and upwards etch that exposes a bottom of the channel region at the bottom of the stack after the memory films, channel material and a dielectric core material have been pre-deposited into the interior of the memory hole. The conduit path can be defined as a laterally extending void formed in a base dielectric and coupled to a vertical passageway extending up from the void and a top of the stack. An etchant is introduced through the conduit path to selectively expose the bottom of the pre-deposited channel material. Then the void is filled with one or more source-forming materials. Several memory holes can be joined to one vertical passageway to allow for concurrent introduction of the source-forming materials (e.g., dopants or doped materials) via the vertical passageway. In one embodiment, after the selective etch exposing the bottom of the pre-deposited channel material is performed, the exposed channel material is heavily doped to thereby reduce its resistance at that location. For example a heat treatment can be performed to cause introduced dopant to diffuse into the channel material upwardly at the bottom of the memory holes.

Finally, a metal is deposited in the vertical passageway and in the lateral conduit void to provide a continuous, low resistance conductive path through the passageway and the void for making contact with a source region provided adjacent to the channel region.

The following discussion provides details of the construction of a memory device and of related techniques which address the above and other issues.

FIG. 1A is a perspective and partially exploded-apart view of a 3D stacked non-volatile memory device. The memory device 100 includes a substrate 101 which is schematically shown merely as a flat plane. However, it is to be understood that the substrate 101 has depth, can be composed of a semiconductive material such as monocrystalline silicon (m-Si) and can have semiconductive elements (e.g., control logic) monolithically integrally embedded therein.

On the substrate 101 there is provided a plurality 110 of highly conductive and spaced apart source lines (SL1, SL2, ..., SLn) each extending longitudinally in a first direction (e.g., the Y direction of the illustrated XYZ reference frame 109). A dielectric material (not explicitly shown) may be provided in the spaces between the spaced apart source lines and/or under them. Additionally, atop the source lines (SL1, SL2, ..., SLn) there is provided further dielectric material denoted as a first insulative layer Ins00. The first insulative layer Ins00 has holes defined therethrough where some of these holes (only 2 of many shown) belong to respective and vertically extending memory holes such as MH11, MH12 and MH22. In the illustrated example, memory holes MH11 and MH12 overlap source line SL1. Memory hole MH22 overlaps source line SL2. Within each memory hole there is implemented a NAND type string of re-programmable and nonvolatile memory elements as well as top and bottom pass transistors (QD and QS—see briefly FIG. 1B) as shall become apparent shortly in the below.

It is to be however, that the configuration shown in FIG. 1A is nonlimiting. The source lines (SL1, SL2, ..., SLn) could have instead been configured to longitudinally extend in the X direction of the XYZ reference frame 109. The source lines could have been interconnected to one another in a comb style by orthogonal interconnect branches or the source lines (SL1, SL2, ..., SLn) could have been replaced by a solid conductive source plate (not shown). An advantage of having spaced apart source lines is to reduce undesired capacitance.

Above the source line(s) layer 110 there is provided a layer 120 gate control lines for corresponding "source side" pass transistors (QS's of FIG. 1B). The source side control lines 120 are denoted as SGS's (Select Gate, Source-end) and in the illustrated example of FIG. 1A they are shown as spaced apart conductive lines (SGS01, SGS02, SGS03, ..., SGS0n; where n can be a fairly large number even though not all SGS's are shown). In the example, the SGS's 120 extend longitudinally in the same Y direction as the source lines of conductive layer 110. However, as mentioned above, the source lines (SL's) of an alternate embodiment extend in the X direction or are provided as a solid plate.

Above the SGS's layer 120 there is provided an insulative layer denoted as Ins0. The vertically extending memory holes (e.g., MH11, MH12, ..., MHnm) pierce through the source side control lines (SGS's); preferably through the width-wise centers of the SGS lines without breaking the continuities of the SGS lines. The vertically extending memory holes also pierce through the overlying and underlying insulative layers, Ins0 and Ins00. The sidewall interface of each SGS line 120 with a respective and piercing through memory hole (MHnm) can serve as a control gate for a respective source-side pass transistor (QS) as shall become apparent shortly in the below.

Disposed above the SGS lines layer 120 and the Ins0 insulative layer is a next conductive layer 130 composed of spaced apart word lines (WL11, WL12, . . . , WL1n) that extend longitudinally in the Y direction. As is the case with the illustrated source lines of conductive layer 110, the word lines (WL11, WL12, . . . , WL1n) can instead extend in the X direction, they can be shorted together or the conductive layer 130 can be configured as a solid plate having memory holes (and other holes, not shown) piercing through it. More specifically, the vertically extending memory holes (e.g., MH11, MH12, . . . , MHnm) are shown to pierce through the word lines (preferably through the width-wise centers of the word lines) without breaking the continuities of the word lines, much in the same way as the memory holes extend vertically through the SGS conductive lines layer 120. The sidewall interface of each word line with a respective and piercing through memory hole (MHnm) can serve as a control gate for a respective re-programmable and nonvolatile memory element (ME) as shall become apparent shortly in the below. Similarly for the case of the SGS conductive lines layer 120, their respective sidewall interface surfaces can serve as a control gates for respective source-side pass transistors (QS).

Between the source lines 110 (SL1, SL2, . . . , SLn) and their respective but spaced above layer 120 of SGS lines (SGS01, SGS02, . . . , SGS0n) there are provided respective source-region-defining regions or plugs at the bottoms of the respective memory holes (e.g., MH11, MH12, . . . , MHnm). In the illustrated embodiment 100, the source region defining regions/plugs are composed of N+ doped semiconductive material (e.g., N+ doped polysilicon) and hence they are denoted in the drawing as N+ source Regions having n and m as matrix coordinates. In more abbreviated form they are denoted as NsRnm's where n is the identifier of the corresponding SGS line SGS0n and m is an identifier of the corresponding memory hole MHnm provided along the longitudinal extent of the source-side gating line SGS0n. The dashed explode-apart alignment line 115 indicates that N+ source region NsR12 makes ohmic contact with the top of source line SL1 and semiconductive contact with the bottom of corresponding memory hole MH12 below where the later hole pierces through source-side gating line SGS01. Similarly, the source region defining plug denoted as NsR11 makes contact with the top of source line SL1 and with the bottom of corresponding memory hole MH11. The pattern repeats for the remaining of the illustrated array of N+ source regions or NsRnm's. However, in the drawing, not shown is the cutting all the way through, of all the vertical memory holes (e.g., MH22, . . . , MH42) through their respective SGS lines 120 and word lines (e.g., 130), this being done to avoid illustrative clutter. Only the memory holes cutting through the right edge of the 3D stack are explicitly shown as cross-sectionally split open ones. It is to be understood that the remainder of the memory holes shown passing through top plane 103 (e.g., MH22 through MH42) also extend vertically down into the first insulative layer Ins00 that is disposed just above the source lines layer 110.

Above the first layer 130 of conductive word lines (e.g., metal word lines) there is provided a next insulative layer Ins1 which is not fully shown in order to avoid illustrative clutter. Atop that next insulative layer Ins1, a second layer of word lines WL2n (where the word lines level number k here is k=2) is provided. The illustrated second level (k=2) of word lines are denoted as WL21, WL22, WL23, . . . , WL2n and are spaced apart from one another while aligningly overlapping respective ones of the source-side gate select lines SGS01, SGS0n and respective ones of the first layer (k=1) word lines WL11, WL12, WL13, . . . , WL1n.

The pattern repeats a large number of times so as to create a tall stack having alternating layers of conductive word lines and interdigitated insulative layers Ins1, Ins2, . . . , InsK, Ins(K+1). The topmost insulative layer (e.g., Ins(K+1) in the example) has a planarized top surface 103 through which the respective memory holes (MHmn) poke.

Disposed above the planarized top surface 103 and aligned with the memory holes while extending longitudinally in the X direction are a plurality of bit lines, BL1, BL2, . . . , BLm. Between the bit lines (BL1, BL2, . . . , SLm) and their respective but spaced below, top layer of word lines (WLk1, WLk2, . . . , WLkn; where k can be a relatively large number such as 10, 20 or even more) there are provided respective transistor drain defining regions or plugs making ohmic contacts at corresponding bottom spots of the respective bit lines (BL) and making semiconductive contacts with respective top regions of the memory holes (e.g., MH11, MH12, . . . , MHnm). In the illustrated embodiment 100, the drain regions or plugs are composed of N+ doped semiconductive material (e.g., N+ doped polysilicon) and hence they are denoted as N+ drain Regions or NdRnm's for short where n is the identifier of the corresponding source-side gate select line SGS0n and m is an identifier of the corresponding memory hole MHnm. The dashed explode-apart alignment line 117 indicates that N+ drain region NdR12 (although pointed to from atop) is disposed so as to make contact with the bottom of bit line BL2 and with the top of corresponding memory hole MH12. Similarly, the drain defining region denoted as NdR41 (although pointed to from atop for illustrative simplicity) is disposed so as to make makes contact with the bottom of bit line BL1 and with the top of corresponding memory hole MH41. The pattern repeats for the remaining of the illustrated array of N+ drain regions or NdRnm's. As the case with the source lines (SL's) the longitudinal direction of these lines is illustrative and in an alternate embodiment they may instead extend in the Y direction.

Referring to the enlarged (magnified) partial image of memory hole MH22 as an example, inside each memory hole there is provided a first sidewall lining 118 that includes a re-programmable charge storage structure and a more inward second lining 116 that includes a channel forming material. In one embodiment, the re-programmable charge storage structure 118 comprises three sublayers, namely, a first oxide sublayer (e.g., a silicon oxide such as $SiO_2$) having a tunnel-enabling thickness, a nitride layer (e.g., a silicon nitride) having a charge-retention enabling thickness, and a second oxide sublayer (e.g., a silicon oxide) having a leakage current and breakdown inhibiting thickness, where the nitride sublayer is interposed between the oxide sublayers. In an alternate embodiment, the re-programmable charge storage structure 118 may have a more complex configuration where, for example the tunnel-enabling sublayer is itself composed of very thin O—N—O subsublayers. The tunnel-enabling sublayer of lining 118 (e.g., the first oxide sublayer of the described ONO structure) may abut directly against the channel region forming material of the second lining 116 while the second oxide sublayer (the leakage blocking sublayer) may abut directly against the respective and surrounding sidewall surface that is formed in the corresponding word line (e.g., WL42, which is to the left of the labeled WL41) where the respective memory hole (MH22) passes through. Accordingly a respective re-programmable and nonvolatile memory element (ME) is formed where the sidewall surface of the word line (e.g., WL42) serves as a control gate, the laterally adjacent portion of the charge storage structure 118 (e.g., ONO) serves as a charge storing and re-programmability enabling region and where conductivity of electrical current passing vertically through the laterally adjacent portion of the channel region forming lining 116 is controllable by a combination of a voltage applied to the word line and an amount of charge pre-stored in the charge storage structure 118 (e.g., ONO).

Referring to the schematic of FIG. 1B, shown is one possible configuration 100' where the bottoms of memory holes MH-1 and MH-2 respectively include source-side pass transistors QS-1 and QS-2 and the N+ source regions (S) of these pass transistors QS-1 and QS-2 make ohmic contact with shared source line (SL). The tops of memory holes MH-1 and MH-2 respectively and similarly include drain-side pass transistors QD-1 and QD-2 and the N+ drain regions (D) of these pass transistors QD-1 and QD-2 make ohmic contact with overlying bit line (BL) portions. In one embodiment, the overlying bit line (BL) portions are part of a same bit line while in another embodiment they belong to different bit lines. A long source feeding line LI extends vertically from the top of the stack to the stack underlying source line SL such that a desired voltage may be applied from the top of the stack to the underlying source line SL. In one embodiment, the source feeding line LI is in the form of an extended slit or trench sometimes referred to as a source trench (ST) that has many memory holes like MH-1 and MH-2 disposed adjacent to but insulated from the conductive material (e.g., metal) provided in the source trench (ST). See briefly for example, the top plan view of ST source trenches in FIG. 8.

Between the respective source-side and drain-side pass transistors, QS and QD of each memory hole (e.g., MH-1 and MH-2) there is provided a respective string of NAND-wise connected memory elements, ME-h1 through ME-hk where h is the number of the memory hole and k is the number of memory elements in the string. A specific memory element (ME-hi) may be addressed for data reading purposes by rendering conductive the source-side and drain-side pass transistors, QS-h and QD-h of its respective memory hole MH-h and then applying saturating gate control voltages to all word lines except the word line of the being addressed memory element (ME-hi). A just-above threshold gate control voltage is applied to the word line WL-i of the being addressed memory element (ME-hi) such that current conduction through that memory element (ME-hi) is controlled by the amount of charge stored in its charge storing layer (shown as a hatched floating gate in FIG. 1B). The amount of charge stored or not stored in the charge storing layer portions of the source-side and drain-side pass transistors, QS-h and QD-h is not generally changed so that these transistors, QS-h and QD-h do not generally operate as programmable elements but rather as NAND-string selecting components.

Referring back to FIG. 1A, for the illustrated configuration, a specific memory element E(n, m, k) may be similarly addressed three-dimensionally and for data reading purpose by applying voltages well above transistor threshold to all the word lines above and below its Z level (its k parameter) while applying a control voltage just slightly above transistor threshold ($V_t$) to its respective word line WL(k, n) and detecting current flow through its respective bit line BL(m) while an appropriate voltage is imposed vertically across the corresponding channel region (116). All portions of the vertically extending channel region (116) that are subjected to the well above threshold control voltages (Vgate>>Vt) will be switched into conductive mode irrespective of the charge stored in their adjacent charge storage structure portions (e.g., ONO portions). On the other hand, conductivity through the channel region adjacent to the memory element driven at just above threshold will depend on the charge stored in its portion of the charge storage structure (e.g., the laterally adjacent ONO portion). Hence a NAND type of memory device is formed.

The embodiment 100 of FIG. 1A may have additional structures provided above its topmost plane 108 (for example passivation and planarization dielectrics) and below its illustrated lowest plane 101 (for example embedded CMOS control logic). However, the focus here is on the formation of the N+ source regions (NsRnm's) and the creation of good contacts between these formed source regions and the respective channel regions 116 above them and the source lines (SLn) below them.

As indirectly indicated above, after a memory hole (e.g., MH22 of FIG. 1A) is formed, for example by anisotropic reactive etching (RIE) in a top down manner, its interior sidewall (and its bottom surface, as shall be seen) is usually first lined with the charge storage structure 118 (e.g., ONO) by sequential deposition of the sublayers (e.g., oxide, nitride, oxide) of that structure 118 and then the interior sidewall of that result (and its interior bottom, as shall be seen) is lined with the channel forming material 116 (e.g., an undoped semiconductor such as undoped polysilicon or a lightly doped semiconductor such as P-polysilicon). Since the bottom N+ source region (NsRnm) has to make semi-conductive contact with the bottom of the more inward channel forming material 116 of its respective memory hole (e.g., MH22), the bottom-surface lining portion of the charge storage structure 118 (e.g., ONO) has to be removed.

Figure 2A:
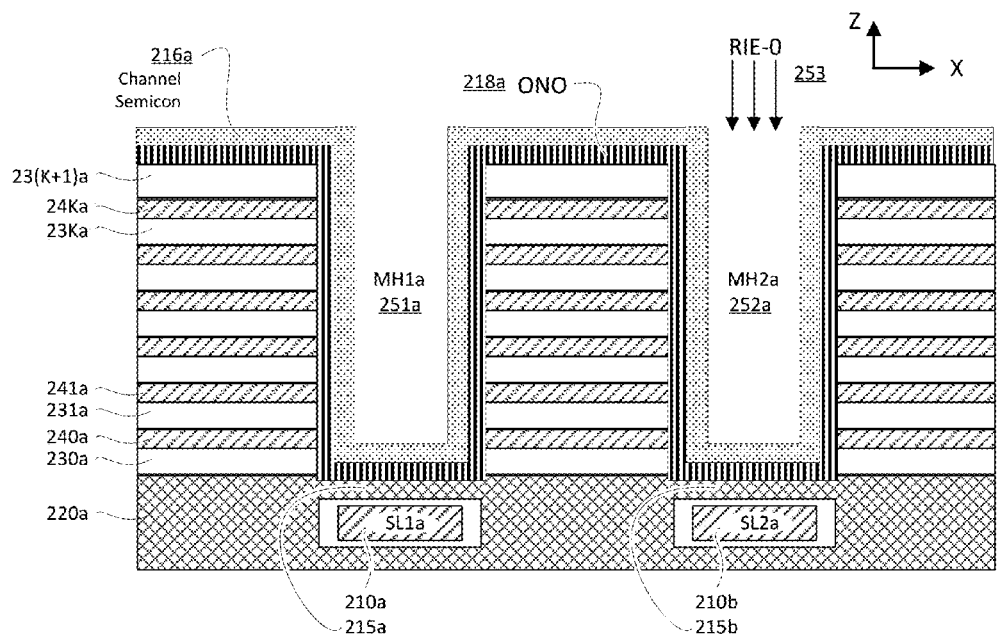
FIG. 2A depicts an example in-process structure where memory holes have been bored and coated with charge storage and channel forming layers.
Figure 2B:
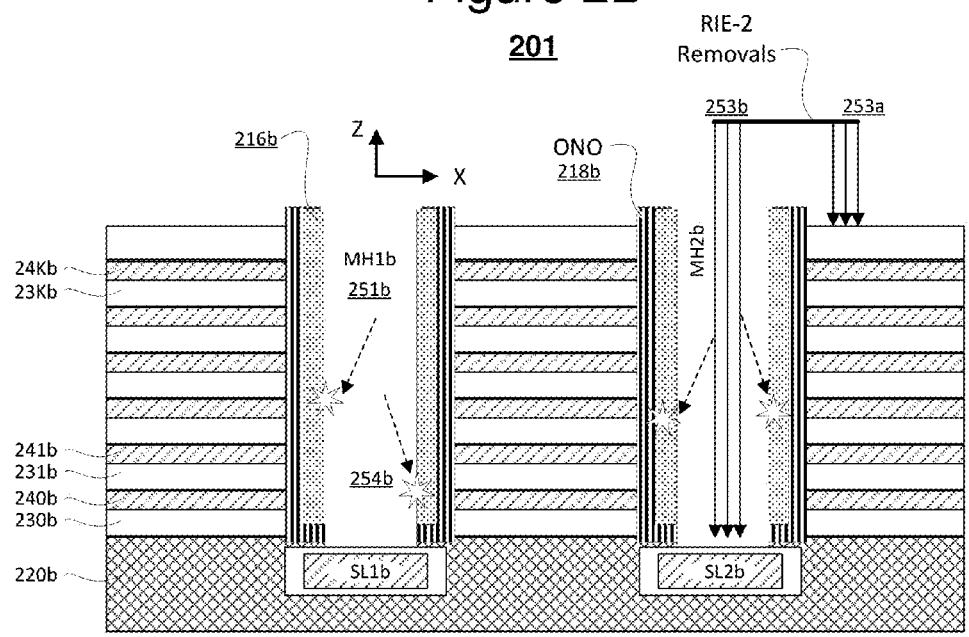
FIG. 2B depicts a problem that may arise when the structure of FIG. 2A is further bored in a top-down manner to thereby create a contact hole through the bottom of the memory holes.

Referring next to the cross sectional schematic views of FIGS. 2A and 2B, a problem will be described as being normally associated with the removal of the bottom-lining portion of the more outward charge storage structure 118 (e.g., ONO) of each respective memory hole. In FIGS. 2A and 2B, reference numbers in the 200 century series will be generally used to identify structures corresponding to those having reference numbers in the 100 century series in FIG. 1A. Such referencing does not mean that same materials are present in FIGS. 2A and 2B as those that ultimately appear in FIG. 1A.

More specifically and referring first to the structure 200 of FIG. 2A, during mass production, a bulk dielectric body 220a is provided and a stack of alternating material layers is formed on that base body 220a. Here, layers 230a, 231a, . . . , 23Ka (K being an integer such as 10 or 20) are composed of a not-to-be-sacrificed dielectric material such as a silicon oxide (e.g., $SiO_2$). On the other hand, layers 240a, 241a, . . . , 24Ka are composed of a sacrificial dielectric material such as a silicon nitride ($SiN_x$), where later in the mass production process they will be selectively removed and replaced with one or more conductive materials, including for example, tungsten (W).

After the stack of alternating layers, 230a/240a, . . . , 23Ka/24Ka are formed; and one additional but thicker dielectric layer 23(K+1)a is added and planarized, a first anisotropic and masked etch 253 (e.g., RIE-0) is carried out to form initial memory holes MH1a and MH2a. The interior walls (sidewalls and bottom walls) of the initial memory holes, MH1a and MH2a as well as the tops of the stacks are covered with a sequence of isotropic depositions of first liner materials, where those first liner materials form the illustrated ONO structure 218a. Thereafter, the resultant interior walls (sidewalls and bottom walls) of the once-coated memory holes, MH1a and MH2a as well as the tops of the stacks are covered with a film of channel forming material 216a (e.g., undoped polysilicon) so as to thereby produce the illustrated, twice coated memory holes 251a and 252a.

In FIG. 2A, there are shown below the twice coated memory holes 251a and 251b, the positionings of corresponding source lines SL1a (210a) and SL2a (210b) as well as the locations 215a and 215b where respective N+ source region plugs are to be formed and are to extend to make semiconductive contact with the overlying channel material 216a. The illustrated source lines, 210a and 210b need not actually be there at this stage of fabrication. They are nonetheless shown simply for explaining why the bottom walls of the interposed ONO structure 218a and of the overlying channel forming material 216a are typically etched through so that a respective void can be created between each of source line locations 210a and 210b and the respectively overlying memory hole, 251a and 252a, where the created voids are thereafter filled with N+ source region forming material (not yet shown).

Referring to FIG. 2B, additional anisotropic etchings 253a and 253b are performed to selectively remove the dual coatings of ONO material 218a and semiconductor material 216a from the tops of the stacks and from the bottoms of the memory holes, thus creating a structure 201 that has defined in it voids communicating from the bottoms of the memory holes (now referenced as 251b and 252b) to the locations of where the respective one or more source lines (now referenced as SL1b and SL2b) will be. A problem with the anisotropic etching 253b vertically down through the memory holes is that such etch processes (e.g., high-energy, reactive ion bombardment processes and/or other material removing etching environment) are not always perfectly vertical and as a result of the high energy bombardments involved (e.g., by Argon ions) undesired removals (e.g., 254b) may occur from the channel region material 216b lining the interior sidewalls of the respective memory holes, 251b and 252b or worse yet from the ONO structure 218b. If a sufficient amount of such damage occurs, it may jeopardize the viability of the to-be-formed NAND-type string of memory elements because in the NAND-type string, uniformity of conduction characteristics serially through the channel region 216b is highly desired and uniformity of conduction characteristics within the ONO structure 218b is also highly desired. Although not explicitly pointed out in FIG. 2B, another related problem is that of reduced surface area for contacting the channel region 216b with the N+ source region plug (not yet shown). The RIE process 253b removes part of the channel region that could have served as usable contact area or usable area for conversion from undoped or lightly doped to heavily doped N+ semiconductive material.

Referring to the cross sectional view of FIG. 3A, a starting structure 301 for producing a memory device in accordance with the present disclosure is shown. A bulk dielectric body 330a composed of a non-sacrificial material (e.g., a silicon oxide in this case) is formed atop a substrate 320a. The bulk dielectric body 330a is conceptually subdivided into a plurality of regions, R0, R1, R2a, R2b, R3 and R5. Voids are to be formed in regions R1 and R2a-R2b and respectively filled with different sacrificial materials (e.g., an amorphous silicon in R1 and a silicon nitride in R2a-R2b for this example) while region R0 serves as a supportive roof and R3 as a foundational floor. Region R5 extends vertically from the base substrate 320a to the top of R0 and, as will be seen later, defines a supporting column similar in function to supporting columns of mine shafts. Although in FIG. 3A only one combination of to-be-voided regions R1 and R2a-R2b is shown, it is to be understood that many such to-be-voided regions R1 and R2a-R2b are provided side-by-side with supporting column regions R5 laterally interposed between them. In FIG. 3A, the planned placements for memory holes MH1p and MH2p are shown in phantom. Region R1 extends horizontally under them while region R2b is positioned to laterally extend beyond an end of region R1 as shown.

Referring to the cross sectional view of FIG. 3B, a subsequent structure 302 for producing a memory device in accordance with the present disclosure is shown. The initial bulk dielectric of region R1 has been replaced with a first sacrificial material 361a while the initial bulk dielectric of regions R2a-R2b has been replaced with a different and second sacrificial material 362a. In the given example, the first sacrificial material 361a is comprised of undoped amorphous silicon (a-Si) while the second sacrificial material 362a is comprised of a silicon nitride (SiN$_x$). The specifics of how regions R1 and R2a-R2b respectively come to be filled with the first and second different sacrificial materials, 361a and 362a may vary. In one embodiment, the bulk dielectric body 330a/b is built up in a layered fashion and the voids for regions R1 and R2a-R2b are created and filled with their respective sacrificial materials, 361a and 362a during the layered-type deposition process where the planned positions for memory holes MH1p and MH2p is kept in mind. In an alternate embodiment, the bulk dielectric body 330a is formed as a unitary body and then sideways extending voids are etched one at a time into the bulk dielectric body 330a and filled with their respective sacrificial materials, 361a and 362a. Yet other variations are possible.

Referring to the cross sectional view of FIG. 4A, a subsequent structure 403 for producing a memory device in accordance with the present disclosure is shown. Here, alternating layers of a not-to-be-sacrificed dielectric material (e.g., a silicon oxide SiO$_x$) 431a, 432a, etc. and of a sacrificial dielectric material (e.g., a silicon nitride SiN$_y$) 441a, 442a, . . . , 44Ka are stacked atop the structure 302 of FIG. 3B and then an anisotropic masked etch (RIE 453) is performed to thereby create the illustrated initial memory holes 451a and 452a, each intruding at least slightly into the sacrificial material 361b of region R1. Material 361b (e.g., a-Si) may act as an etch stop.

Figure 4B:
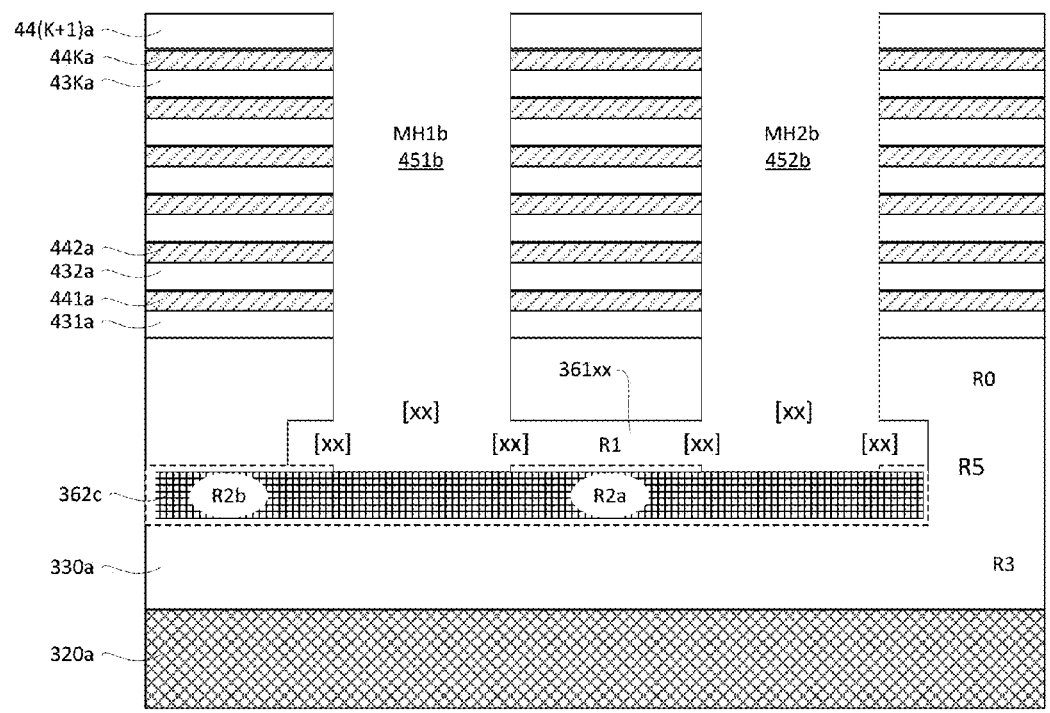
FIG. 4B schematically depicts selectively removing the first sacrificial material of the first region.

Referring to the cross sectional view of FIG. 4B, a next subsequent structure 404 for producing a memory device in accordance with the present disclosure is shown. Here, the first sacrificial material 361a (e.g., a-Si) of FIG. 4A has been selectively removed while leaving the rest of the structure intact. In one embodiment, an isotropic wet etch is used specific to the removal of the first sacrificial material 361a (e.g., a-Si) and introduced by way of the just-formed initial memory holes 451a, 452a, where after the wet etch and a subsequent rinse the memory holes are referenced as 451b and 452b. A void 361xx is now left behind in the region R1 previously occupied by the first sacrificial material 361a (e.g., a-Si) where the void communicates with the overlying memory holes 451b and 452b. The bracketed symbol, [xx] is used in FIG. 4B to indicate an area that is part of a void.

Figure 5A:
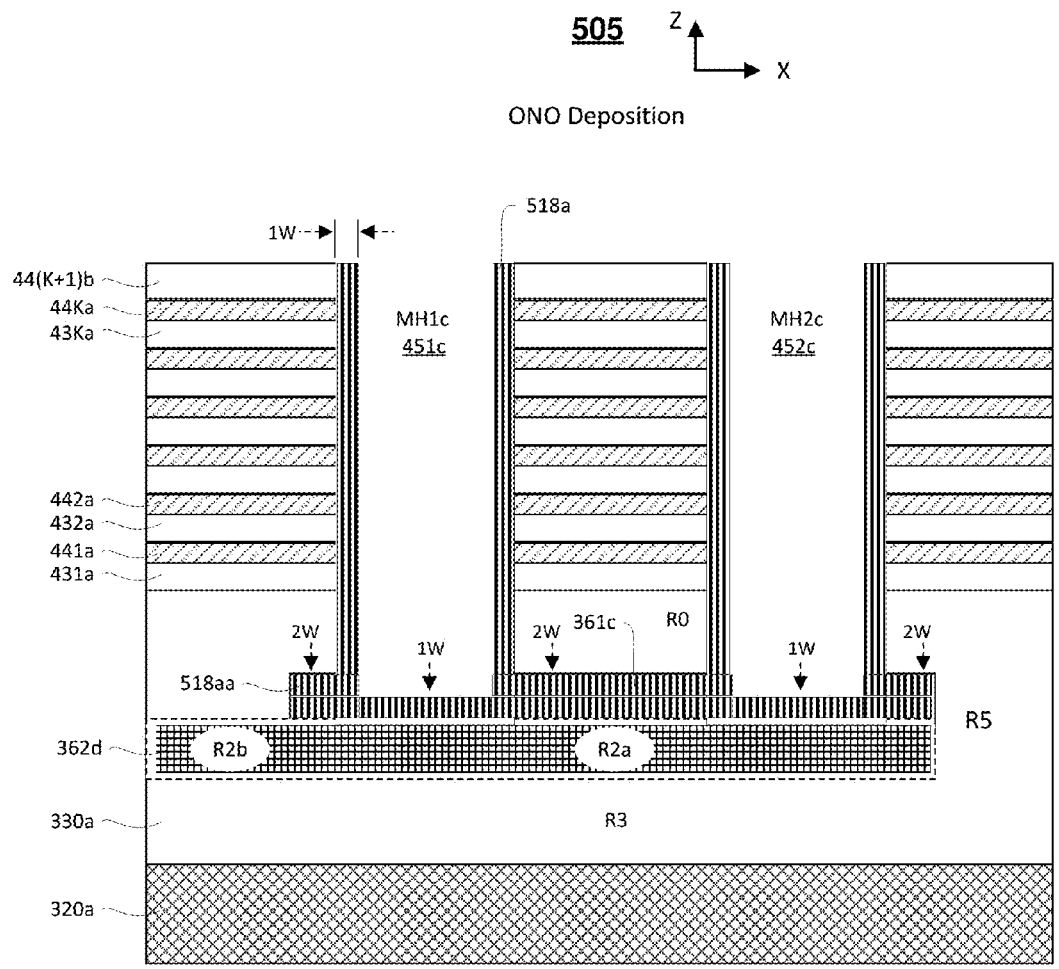
FIG. 5A schematically depicts a depositing of the charge storage material to a predetermined single-thickness in some areas and a greater than single-thickness thickness in other areas.

Referring to the cross sectional view of FIG. 5A, a next structure 505 for producing a memory device in accordance with the present disclosure is shown. Here, an ONO film 518a having a predetermined thickness of 1W has been isotropically deposited on all exposed surfaces by means of vapor deposition. The memory holes with the ONO film 518a deposited on their interior sidewalls are denoted as 451c and 452c. It is to be understood that following the deposition, the top surface of the structure 505 was planarized down to the top of the topmost non-sacrificial dielectric material 44(K+1)b where latter is suffixed as b rather than 'a' because it was subjected to the planarization process. Not mentioned earlier is that for one embodiment (not the only way, see briefly FIG. 5D to be discussed below), region R1 was pre-designed to have a height not greater than 2 times the predetermined first thickness (1W) of the ONO deposition 518a but substantially greater than the 1W dimension. Since the ONO film 518a isotropically forms along all exposed surfaces, it forms on the remaining ceiling and sidewall surfaces of region R1 as well as forming on the floor of voided region R1. As a result, in areas of the voided region R1 that retain the ceiling (the bottom of R0), the ONO deposition of this embodiment can grow to a self-sealing thickness of as much as 2W, for example in the region denoted as 518aa. The above proviso for having the height of region R1 pre-designed to be "substantially" greater than the 1W, first thickness dimension of the ONO deposition is made with reference to a next to be carried out, "from the bottom upwards" etch (see briefly FIGS. 6C-6D). The term "substantially" greater as used here means that the next to be carried out from-the-bottom-upwards etch (having a planned, upward end depth of 1W or slightly greater) will not cut through the "substantially" greater than the 1W height dimension of the R1 region. In the illustrated example, it is assumed that the pre-specified height of the R1 region was just slightly less than 2W and the isotropic ONO deposition fully filled the corresponding region 518aa while being 1W thick in areas overlapped by the memory holes 451c and 452c. The more-than-1W thick and self-sealed region 518aa, and its alike companions such as in region 361c lie under the vertical bottoms of the 1W thick, and vertically extending portions of the ONO film 518a and thus protect the vertical bottoms from a soon-carried out selective upward-etch that removes 1W thick bottom portions of the deposited ONO layers.

Referring to FIG. 5B as a continuation of the embodiment depicted in FIG. 5A, in a subsequent step, a channel region forming film 516d (e.g., undoped or lightly doped polysilicon) having a predetermined thickness has been isotropically deposited on all exposed surfaces by means of vapor deposition so that the next structure 506 for producing a memory device in accordance with the present disclosure has further narrowed memory holes now denoted as 451d and 452d as shown with the channel region forming film 516d coating both the bottom and interior sidewalls of the memory holes, 451d and 452d. As in the case of FIG. 5A, it is to be understood that following the deposition, the top surface of the structure 506 was optionally planarized down to the top of the topmost non-sacrificial dielectric material 44(K+1)c where latter is suffixed as 'c' rather than 'b' because it was subjected to the planarization process. Alternatively, the planarization of the tops (e.g., by a CMP process) of the stack may be carried out after a number of layers are deposited; for example after the next-described, core fill operation of FIG. 5C.

Referring to FIG. 5C, in a subsequent step, the remainder of the interiors of the memory holes (the left one now being referenced as 451e) are filled with a non-sacrificial dielectric material 517e such as a silicon oxide (e.g., SiO$_2$). The core fill 517e provides structural support as well as protective covering for the already deposited channel region forming film 516e (now labeled with the 'e' suffix rather than 'd' because it is covered by core fill 517e). Additional structural support for the resulting in-process structure 507 is provided by regions R5 (only one shown) which are distributed between groups of memory holes (only one group of two shown) where those groups share sacrificial material regions R1 and R2a-2b. The supporting regions R5 function similar to columns in mine shafts and keep the structure from collapsing at times that sacrificial material regions R1 and R2a-2b are void.

FIG. 5D schematically depicts an alternate embodiment 507. Here, unlike the case of FIG. 5A, the R1 region had a vertical depth greater than 2W. More specifically, the R1 region had a vertical depth equal to 2W plus the vertical thickness of material layer 516ee (where the greater than 2W thickness is referred to herein as a "2W+" thickness). When the outer oxide of ONO layer 518b was deposited, lower portion 518bb did not become a self-sealing 2W thick portion. Instead room was left for filling in by the vertical thickness of the afterwards introduced material layer 516ee.

In one embodiment, the afterwards introduced material layer 516ee is a semiconductive layer 516ee and more specifically, it is composed of the same material as that of the vapor-deposited and vertically-extending channel sidewall(s) 516e, for example, undoped amorphous silicon (aSi). FIG. 5D is not to scale and the relative thickness of material layer 516ee may be substantially smaller than what is illustrated.

In one alternate embodiment, semiconductive layer 516ee is instead composed of a heavily doped semiconductive material such as N+ silicon. The vertically-extending channel sidewall(s) 516e' remain as undoped (or lightly P– doped) regions at least starting at the level of sacrificial dielectric material layer (e.g., a silicon nitride SiN$_y$ layer) 441a and extending up to the level of sacrificial layer 44Ka. There are several ways to reach such an end result of having heavily doped (e.g., N+ doped) bottom portions 516ee for forming source regions and undoped, or lightly P– doped vertical sidewall regions 516e for forming channel regions (all while substantially adhering to the end goal of not damaging the pre-deposited storage material sidewall(s) 518b). In one embodiment, the heavily doped semiconductive material of layer 516ee is deposited into what is left of the R1 void (see 361xx of FIG. 4B) after the storage material sidewall(s) 518b' have been formed by use of any suitable void filling techniques, including for example sputter deposition and vapor deposition. Then, a selective wet etch that does not remove the material of the pre-formed storage material sidewall(s) 518b' is used to remove excess amounts of the heavily doped semiconductive material (e.g., N+ silicon) that overflows above the level of horizontal layer region 516ee. Then the undoped (or lightly P– doped) and vertically-extending channel sidewall(s) 516e' are vapor deposited. Then a heat process (optionally at a late time) may be used to diffuse some of the dopants (e.g., N+) in the heavily doped horizontal layer region 516ee upwardly into the horizontally extending portions of the undoped (or lightly P– doped) regions that form when the channel region sidewalls 516e' are formed by vapor deposition. Since a high energy anisotropic etch is not used in this alternate process flow, the pre-formed storage material sidewall(s) 518b are not exposed to the same kind of damage-causing environment as that of the high-energy anisotropic etch on of FIG. 2B and the goal of minimizing damage can therefore be realized. At the same time a larger contact area for a subsequently added, source contacting metallization (see for example 362w of FIG. 7B) is provided by the heavily doped and horizontally extending layer 516ee.

FIG. 5E depicts a subsequent manufacturing step 508' for the embodiment 507 of FIG. 5D. After the dielectric cores (571e' of FIG. 5D) are deposited into the remaining voids of the memory holes, a selective etch makes room for deposition of the illustrated drain plugs 519 at the tops of the memory holes. In one embodiment, a blanket deposit of N+ silicon is used to fill the holes formed in regions 519 and then a CMP or like planarization to the level of the 4(K+1)d dielectric removes excess N+ material. Thereafter, protective silicon oxide layer 521 (e.g., SiO2) is deposited and planarized. The top of the structure is thereby protected prior to formation of source-accessing vertical tranches (ST trenches) that will next be formed in areas corresponding to conversion slit 640 of next described FIG. 6A.

Referring to FIG. 6A, in a subsequent step for the embodiment of FIG. 5C, a protective cover 517$f$ (e.g., a silicon oxide) is formed on the top of the illustrated structure 608 and a so-called, word lines conversion slit or pre-source slit trench (pST) 640 is formed (e.g., by selective RIE) over region R2$b$ but stopping just below the depth of what was sacrificial material layer 441$a$ (e.g., an SiN layer). The material of layer 441$a$ is now replaced with non-sacrificial metallized layer 641$b$ (word line layer 641$b$). In more detail, after the word lines conversion slit 640 is formed, an isotropic etch that is selective for removal of the sacrificial material (e.g., SiN) of sacrificial material layers 441$a$, 442$a$, . . . , 44K$a$ but does not significantly etch into oxides (such as the outer oxide of ONO layer 518$b$) is used to create temporary voids in those layers. Oxide cores 517$e$ help provide structural support while layers 441$a$, 442$a$, . . . , 44K$a$ are temporarily void. Then those layers are isotropically filled with a predetermined conductive metal such as tungsten (W). The so-metallized word line layers are now denoted in FIG. 6A as 641$b$, 642$b$, . . . , 64K$b$. During and/or after the isotropic filling of the temporary voids of layers 441$a$, 442$a$, . . . , 44K$a$ with the conductive replacement material (e.g., tungsten) an anisotropic etch is performed down conversion slit 640 so as to clear it of the conductive replacement material (e.g., W) so that when the filling of the voided layers is complete, those filled layers, 641$b$, 642$b$, . . . , 64K$b$, are not shorted to one another by left over conductive material inside the conversion slit 640. In one variation, prior to the isotropic filling of the temporary voids of layers 441$a$, 442$a$, . . . , 44K$a$, a temporary etch stop material is deposited at the bottom of the conversion slit 640. The temporary etch stop material prevents the formed conversion slit 640 from expanding down into the R2$b$ region while the material replacement process is carried out for layers 441$a$, 442$a$, . . . , 44K$a$. Thereafter, the temporary etch stop material is selectively removed.

Referring to FIG. 6B, in a subsequent step, a protective cover 617$f$ (e.g., a silicon oxide) is formed on the interior sidewalls of the word lines conversion slit 640 (of FIG. 6A) and then a second anisotropic etch (RIE2) is performed so as to continue the vertical passageway (now referenced as ST slit 660) down to the level of region R2$b$ as shown. The passageway-exposed sacrificial material of regions R2$b$ and R2$a$ is now referenced as 362$e$.

Referring to FIG. 6C, in a subsequent step, a selective isotropic etch introduced by way of passageway 660 removes the sacrificial material of exposed layer 362$e$ so as to replace it with a voided area 362$xx$. A second selective isotropic etchant 363 is introduced by way of vertical passageway 660' and horizontally extending voided area 362$xx$ to selectively remove a 1W or slightly thicker portion of the pre-deposited ONO material 362$d$ in a from-the-bottom upwards manner.

Figure 6D:
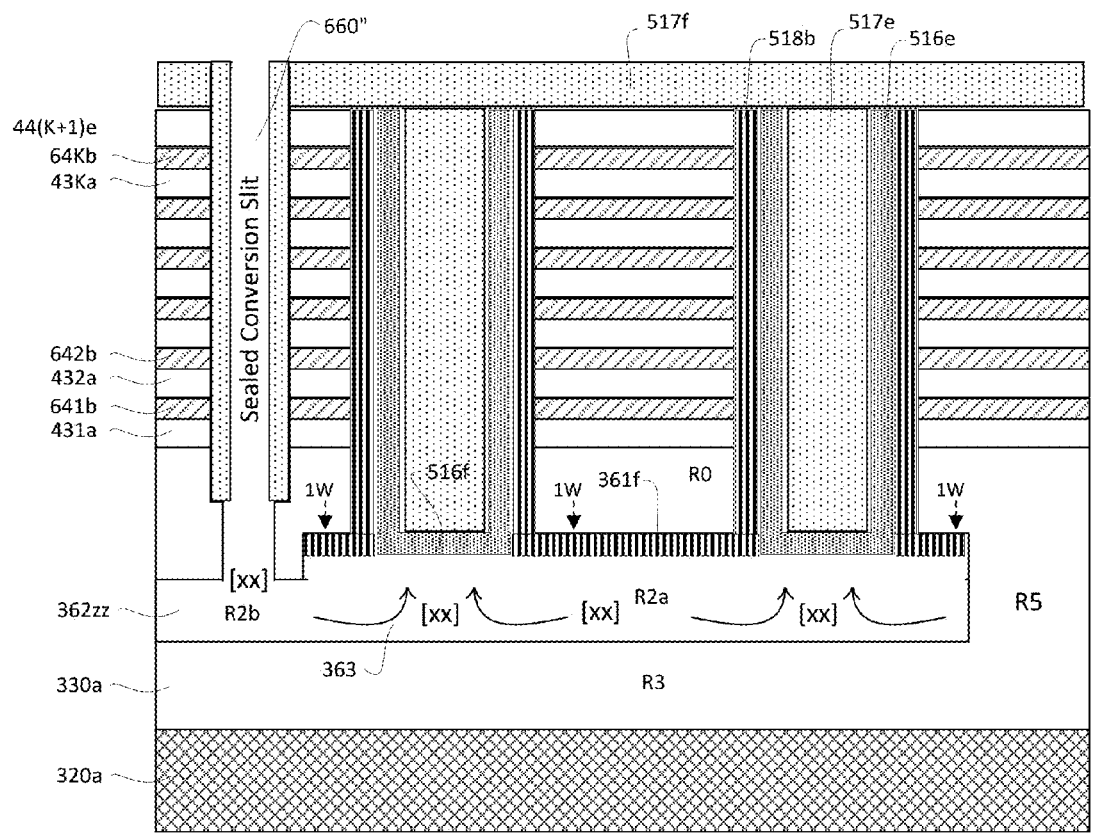
FIG. 6D schematically depicts a state where the predetermined single-thickness of the charge storage material has been upwardly etched away.

Referring to FIG. 6D, the end point of the from-the-bottom upwards selective etch 363 is the exposure of the bottom surface of the channel region material 516$f$ at the bottoms of the memory holes. The void region R2$a$-R2$b$ has now grown in size in an upward direction to become void region 362$zz$. At the same time, a 1W thickness (or slightly more, but not approaching a 2W thickness) of the ONO material has been selectively removed in a bottom upwards manner so as to leave behind a 1W thick (or slightly thinner) layer of ONO material now denoted as 362$f$. At the same time, the operative memory element layers 516$e$ and 518$b$ that are disposed inside the memory holes have not been subjected to a potentially damaging etch. Thus the reliability of memory elements produced by the process is increased.

With reference to the combination of FIGS. 6C-6D and the alternate embodiment of FIGS. 5D-5E, it is to be understood that the extent and selectivity of the from-the-bottom upwards etch (363) may be suitably varied depending on the thickness and the nature of the material(s) provided in layer region 516$ee$ of FIG. 5D and the functions, if any (e.g., to serve as an N+ source) desired from said material(s).

Figure 7A:
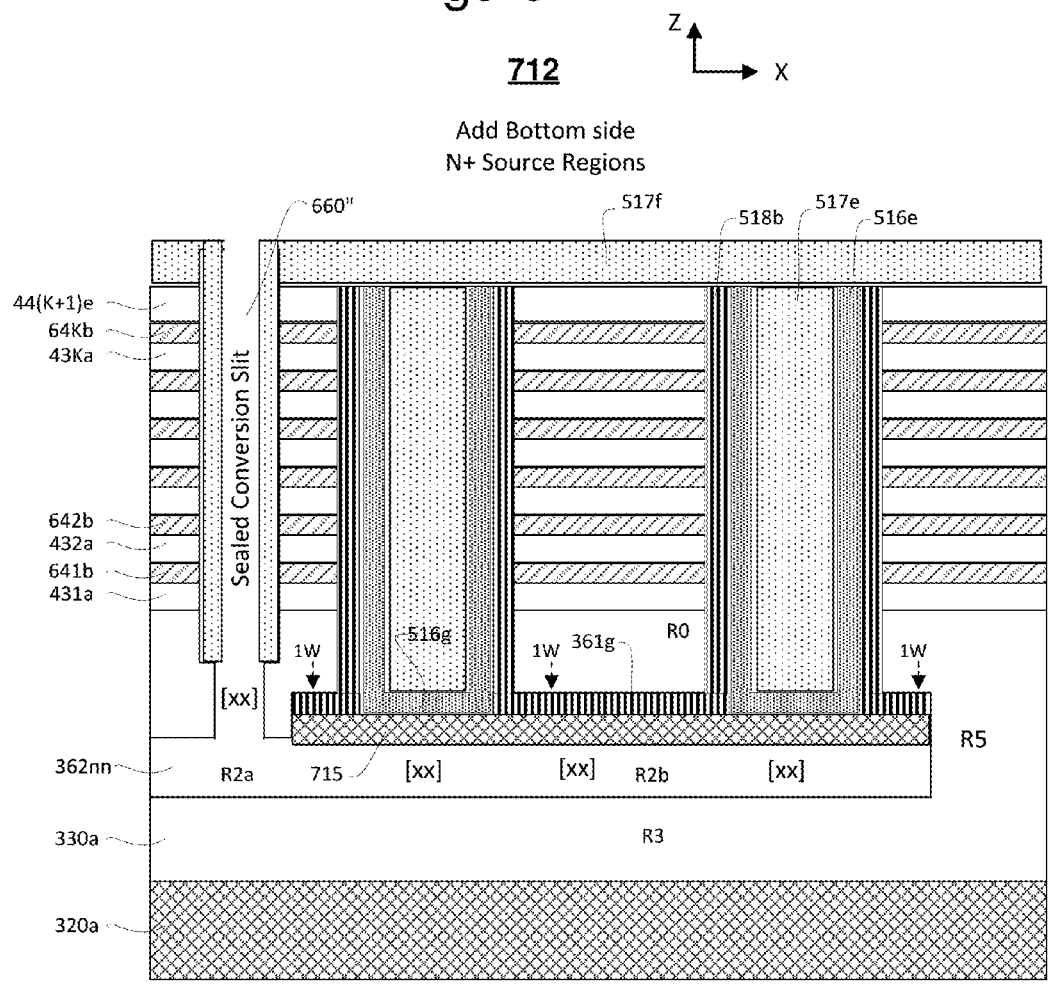
FIG. 7A schematically depicts a depositing of source region-forming material onto the exposed bottom of the channel material.

Referring next to FIG. 7A, the same combination of vertical passageway 660 and horizontally extending voided area 362$xx$ is used as a conduit to selectively create at least one of N+ doped source regions at the exposed bottom portions 516$g$ of the channel films and contacts to those N+ doped source regions. There are several possible variations on the creation of the N+ doped source regions. One possibility has already been disclosed by way of the above description of the alternative embodiment 507' of FIG. 5D in which region 516$ee$ had been pre-filled with an N+ doped semiconductive material such as N+ Si. Referring back to FIG. 7A, in another but more difficult to achieve approach, an N+ doped plug 715 (e.g., polysilicon) is vapor deposited onto the exposed bottom 516$g$ of the undoped (or lightly doped) channel region forming film as well as adhering to the ceiling of the R1 region, whereby the formed N+ doped plug 715 can provide a means of making an ohmic electrical connection from an attached metal conductor to the NAND string. The sealed and extended conversion slit 660" is kept open during this process by one or more vertical anisotropic etchings (REI's). The floor of region R2$a$-R2$b$ may be cleared of the material of the N+ doped plug 715 by way of a thin film wet etch that attacks only the floor but not the ceiling. In one variation, before the material for the N+ doped source region plug 715 is introduced, one or more dopants are introduced through the same combination of vertical passageway 660' and horizontally extending voided area 362$xx$ for doping the exposed underside 516$g$ of the channel region forming material. The optional doping may include an N or N+ doping of the exposed underside portion 516$g$ of the channel region forming material. Once the N+ doped source region plug 715 is introduced (for example by vapor deposition), the size of previous void 362$zz$ is reduced and thus it is now denoted as 362$nn$. In another variation, only the N+ vapor doping of the exposed underside 516$g$ of the undoped (or lightly doped) channel region is performed and the N+ doped source region plug 715 is not added.

Referring to FIG. 7B, the combination of vertical passageway 660" and horizontally extending voided area 362$nn$ is filled with a metal interconnect material such as tungsten (W) to thus form a metalized interconnect 362$w$ making ohmic contact with the N+ source region (e.g., with N+ ceiling plug 715) and extending up through vertical passageway 660' so as to connect with external circuitry. The top of the illustrated structure 713 has been planarized to remove the previous oxide protective layer 571$f$ and, in one of various embodiments; N+ drain plugs 717 have been attached to the tops of the memory holes so as to form the drain regions of the NAND memory element strings. (In an alternate embodiment, the N+ drain plugs or caps had been pre-formed as in FIG. 5D before the LI hole is formed.) The filled-with-conductor vertical passageway 660" now defines the LI connection line between the top of the stack and formed source line in region R2a-R2b. Although not shown, in one variation, source plug layer 715 is not present and instead metallization 362w rises to make direct contact with the exposed underside 516g of the channel material where that exposed underside 516g had been pre-doped by way of N+ vapor doping of the exposed underside of portion 516g. There are tradeoffs for each of the various approaches disclosed here.

FIG. 8 shows one possible top plan view configuration 800 for the embodiment of FIG. 7B. The illustrated pattern is understood to be repeated vertically and horizontally. Items 362w represent top plan views of respective source trenches (ST) that interconnect to underlying source regions of adjacent memory holes (MH). Dashed items R5 represent top plan views of the respective locations where the buried R5 support columns are positioned. The R5 support columns are staggered to define a relatively uniform distribution of memory holes, source trenches (ST's 36w') and R5 support columns. The goal is to maximize the density of the memory holes (MH) while providing sufficient columnar support by way of the R5 pillars during the sacrificial-to-metal conversion process of FIG. 6A. Other patterns are of course possible.

Figure 9:
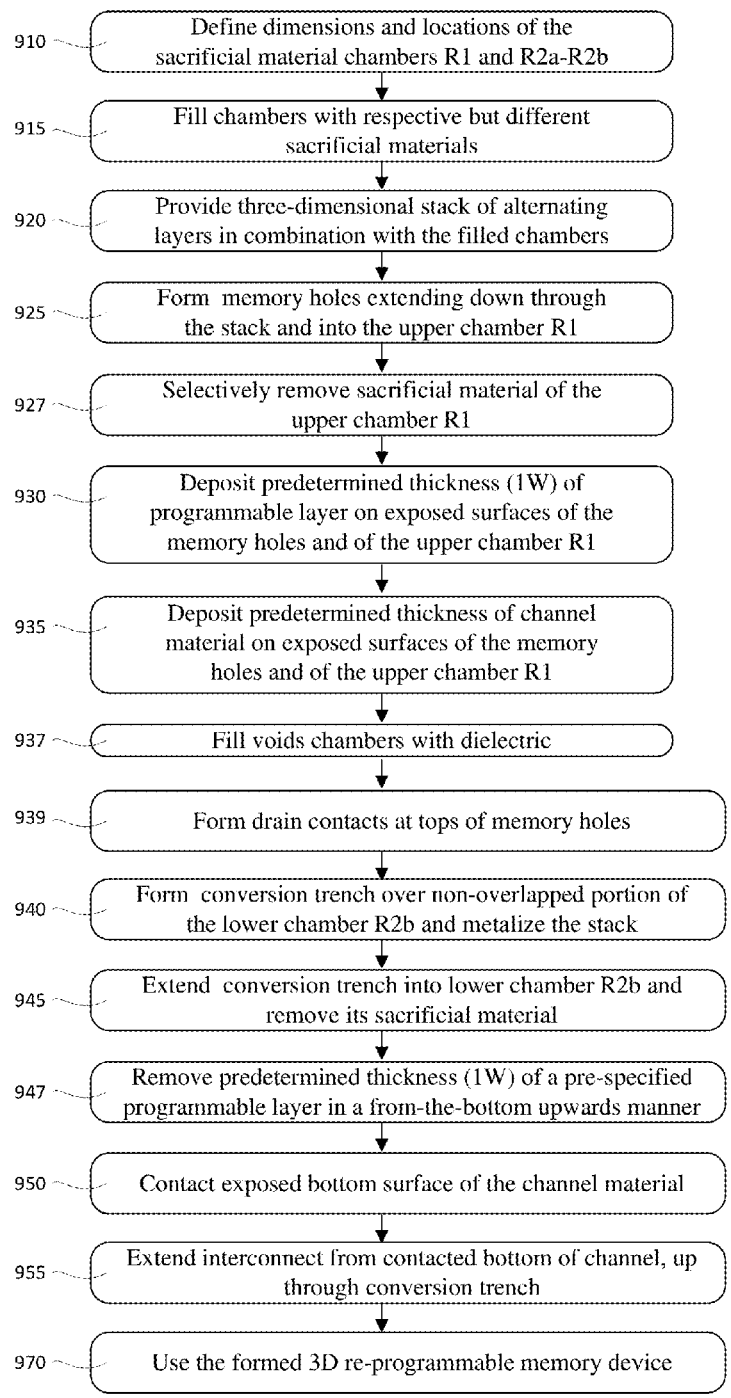
FIG. 9 depicts a flowchart overview of a method for fabricating the 3D stacked non-volatile memory device.

FIG. 9 provides a flow chart of a fabrication process 900 in accordance with the present disclosure. In step 910, the dimensions and locations of the sacrificial material chambers R1 and R2a-R2b are defined. FIG. 3A provides an example of such a step.

In step 915, the chambers R1 and R2a-R2b are filled with respective but different sacrificial materials, for example an amorphous semiconductor (e.g., a-Si) in the upper chamber R1 and a silicon nitride ($SiN_x$) in the lower and wider chamber R2a-R2b. FIG. 3B provides an example of such a step.

In step 920, a three-dimensional stack of alternating layers is provided in combination with the filled chambers. In step 925, initial memory holes are formed extending down through the stack and into the upper chamber R1. FIG. 4A provides an example of such steps.

In step 927, the sacrificial material of the upper chamber R1 is selectively removed. FIG. 4B provides an example of such a step.

In step 930, a predetermined thickness (1W) of a pre-specified programmable layer is isotropically deposited so as to coat exposed surfaces of the memory holes and of the upper chamber R1. FIG. 5A provides an example of such a step.

In step 935, a predetermined thickness of a pre-specified channel material is isotropically deposited so as to coat exposed surfaces within the coated memory holes and coated upper chamber R1. FIG. 5B provides an example of such a step.

In step 937, remaining voids within the coated memory holes and coated upper chamber R1 are filled with a dielectric. FIG. 5C provides an example of such a step.

In step 939, contacts, such as in the form of N+ drain plugs at the top are added to the tops of the memory holes for formation of the NAND type memory elements. FIG. 5E provides an example of such a step.

In step 940, a conversion slit trench is formed over a non-overlapped portion of the lower chamber R2b and is used to metalize the stack. FIG. 6A provides an example of such a step.

In step 945, the conversion trench is extended to communicate with the lower chamber R2A-R2b and to selectively remove the sacrificial material of the lower chamber R2A-R2b. FIGS. 6B-6C provide an example of such a step.

In step 947, the voided lower chamber R2A-R2b is used to deliver an etchant for removing the predetermined thickness (1W+) of a pre-specified programmable layer in a from-the-bottom upwards manner, thus avoiding damage to the materials inside the memory holes while exposing the channel film. FIGS. 6C-6D provide an example of such a step.

In step 950, the exposed bottom surface of the channel material is doped and/or contacted, for example with a heavily doped semiconductor. FIG. 7A provides an example of such a step.

In step 955, an interconnect is added from the contacted bottom surface of the channel material and up through the extended conversion trench. FIG. 7B provides an example of such a step.

In step 970, the formed NAND type memory elements are used for re-programmably storing data. FIG. 1A or 1B provide examples of three-dimensional structures having such functionality.

Various materials and processes are discussed herein. In one example implementation, the plurality of materials used for the ONO layer include a blocking oxide, followed by a stoichiometric silicon nitride (e.g., $Si_3N_4$), followed by a tunnel oxide so as to form the oxide-nitride-oxide (O—N—O) configuration. The blocking oxide and tunnel oxide can each include a respective one or more of, e.g., a silicon oxide, a silicon nitride, a silicon oxynitride, or other appropriate dielectrics including high-k insulating materials. The blocking oxide and tunnel oxide can be the same material or different materials. Silicon nitride is an example of a programmable film which can be altered to store charge representing discrete data levels. For example, silicon nitride is an example of a charge storage material or charge trapping material which can store no charge, or a specified amount of charge, where these detectable states correspond to respective discrete data states.

In one example embodiment, in the final configuration of the stack, the control gate layers are metal and a channel layer is polysilicon, so that memory cells in a metal-oxide-nitride-oxide-silicon (MONOS) configuration are provided. In another example, the control gate layers are doped polysilicon and the channel layer is polysilicon, so that memory cells in a silicon-oxide-nitride-oxide-silicon (SONOS) configuration are provided. Other configurations are possible as well.

In one embodiment, doped polysilicon is provided at the tops and bottoms of the respective memory holes. The undoped or lightly doped channel polysilicon film can defined a channel of a multi-gated NAND string device. Generally, the channel material which is proximate to the memory cells in the memory holes is undoped although it can alternatively be lightly doped with a conductivity type opposite that of the source and drain plugs. The channel material in a memory holes is sometimes referred to as the body of its respective NAND string.

Example of isotropic removals described herein include a wet etch and a vapor etch. A wet etch involves supplying a liquid phase etchant for example by way of a provided vertical or horizontal passageway. A vapor etch involves supplying a vapor phase etchant by way of the passageway. These isotropic etches can be selective ones which selectively and substantially remove one dielectric material but not another one (e.g., being preferential for $SiN_x$ but not $SiO_y$).

As mentioned one option in processing the exposed channel region involves doping the channel material exposed by the passageway and chamber void. For example, this can involve gas phase doping in which a dopant is supplied at the top of the passageway. In one approach, a dopant at a concentration of 10^20 to 10^21 cm-3 or more can be used. An n-type dopant such as Arsenic can be used, for instance. A high doping concentration is desirable to reduce the resistance of the channel material where contact is to be made with the source region plug. After that, there is the option to deposit additional heavily doped polysilicon (e.g., N+) on the doped channel material. This results in a thicker region of doped polysilicon making good contact to the channel. The additional polysilicon may be more heavily doped than the doped channel material. The additional polysilicon may be introduced via the passageway, and may or may not subsequently be removed from the passageway. This step thus involves introducing additional doped material to the void via the passageway, after the doping the portion of the channel material which is in the void.

The process of forming the source region may include performing a heat treatment, e.g., anneal, for the memory device to cause the present dopants to diffuse upward into the channel material in the memory holes, starting from the bottoms of the memory holes. This involves applying heat after the doping, where the heat causes the dopant to diffuse upwards in a portion of the channel material. The anneal time and temperature will determine the upward distance of the diffusion in the channel material. As a rough example, a temperature of 1000 degree C. for 10 seconds can be used. The anneal conditions depend on the specifics of the geometry, dimensions, and materials. The upward diffusion of the dopants can be helpful in allowing the formed transistors to operate more efficiently. Generally, the heating time and duration, or thermal budget, can be controlled to cause the dopants to diffuse upward in the channel material to a position below a bottom most control gate layer of the control gate layers. The diffusion can be approximately even with the bottom of the bottom control gate layer in one instance.

The order of the steps as described is not necessarily so required. For example, the heat treatment can be performed after interconnect metal is deposited. Planarization can be carried out as a last step after all other materials fill their respective voids.

Examples of high conductivity materials that can be used include Tungsten (W). An adhesion layer such as titanium nitride (TiN) may be deposited before the metal to help adhere the metal to abutting polysilicon material. In one embodiment, a cap material is deposited at the tops of the memory holes. A contact material can then be formed on the cap material by appropriate patterning of the cap and contact materials.

In one possible implementation, rather than using just tungsten (W) the control gate layers comprise polysilicon which is doped during deposition, and these layers remain in the final memory device. Optionally, the control gate layers are treated to convert them to a metal silicide. In another possible implementation, a sacrificial material is initially provided in the control gate layers and this material is replaced with a highly conductive material such as metal in the final memory device.

In one embodiment, memory holes and slits or trenches have uniform cross-sections through the height of the stack, in the z direction. In an alternate embodiments, the cross-section is tapered, becoming narrower at the bottom of the stack.

From the above, it can be seen that one embodiment provides a method for fabricating a 3D stacked non-volatile memory device. The method includes: forming a memory hole in a stack, the stack comprising alternating control gate layers and dielectric layers on a substrate dielectric; forming a void in a substrate dielectric, a bottom of the memory hole is exposed by way of an underlying void; forming a passageway in the stack between a top of the stack and the void; depositing a plurality of materials in the void and the memory hole, the plurality of materials comprising a programmable material (e.g., ONO), a channel material (e.g., undoped polysilicon) and a dielectric material (e.g., $SiO_2$); removing a sacrificial material from the underlying void so as to expose a portion of the channel material from its bottom and making contact with the so-exposed channel material by way of a bottom-up etch.

More specifically, in one embodiment, there is provided a method of fabricating a three-dimensional stacked non-volatile memory device, comprising: (a) sequentially coating an interior of a memory hole with a layer of programmable material having a first thickness and then with a layer of channel forming material having a second thickness; and (b) selectively etching up from underneath the memory hole and through the first thickness of the programmable material to thereby expose a bottom portion of the channel forming material without substantially reducing the second thickness.

Moreover, in one embodiment, there is provided a method of fabricating a three-dimensional stacked non-volatile memory device, comprising: (a) providing a dielectric bulk body; (b) providing in a first cavity within the dielectric bulk body, a first sacrificial material different from that of the dielectric bulk body; (c) providing within a second cavity of the dielectric bulk body, a second sacrificial material different from that of the dielectric bulk body and different from the first sacrificial material, the second cavity contiguously abutting with and connecting with an underside of the first cavity; (d) forming on the dielectric bulk body, a stack comprised of alternating third and fourth materials, the third material being a not-to-be-sacrificed dielectric and the fourth material being a sacrificial one that can be later replaced by a conductive control gate material; (e) forming through the stack and extending down into the first sacrificial material of the first cavity, a memory hole; (f) selectively removing from the first cavity, the first sacrificial material so as to thereby forming a corresponding first void in the dielectric bulk body, where the first void has a height greater than a predetermined deposition thickness and where a bottom of the memory hole communicates with the first void; (g) depositing onto interior surfaces of the memory hole and of the first void, a programmable material, the deposition providing a coating of the predetermined deposition thickness in empty areas of sufficient height to not be fully filled by the deposition therein of coating having the deposition thickness and the deposition filling up empty areas of the first void having a height less than or equal to the twice the deposition thickness, whereby the deposited programmable material has a thickness greater than the predetermined deposition thickness in areas of the first void not overlapped by the memory hole and has the predetermined deposition thickness in areas of the first void overlapped by the memory hole; (h) depositing onto respective interior surfaces of the memory hole and of the first void which are already coated by the deposited programmable material, a channel material; (i) selectively removing from the second cavity, the second sacrificial material so as to thereby forming a corresponding second void in the dielectric bulk body, the second void being adjacent to and exposing a bottom of the programmable material having the predetermined deposition thickness; and (j) using the second void as a conduit for subjecting the exposed bottoms of the programmable material to an etchant that selectively etches the programmable material, where the subjecting with the etchant is sufficient to remove the predetermined deposition thickness of the programmable material and to thereby expose a bottom portion of the deposited channel material; and whereby a contact hole is created by the selective etching so as to expose the channel material in a from-the-bottom upwards manner such that the interior of the coated memory hole is not subjected to the etchant.

Additionally, in one embodiment, there is provided a three-dimensional stacked non-volatile memory device, comprising: (a) a memory hole formed through a stack of alternating word line and dielectric layers, the memory hole having an interior sequentially coated with a layer of programmable material having a first thickness and then with a more interior layer of channel forming material having a second thickness; (b) a source region disposed at an underneath portion of the channel forming material, the underneath portion being disposed at the bottom of the memory hole; and (c) a horizontally extending layer of the programmable material disposed under the stack of alternating word line and dielectric layers.

The foregoing detailed teachings have been presented for purposes of illustration and description. They are not intended to be exhaustive or to limit the present disclosure of to the precise forms disclosed. Many modifications and variations are possible in light of the above teachings. The described embodiments were chosen in order to best explain the principles of the present disclosure of and its practical application, to thereby enable others skilled in the art to best utilize the novel teachings in various embodiments and with various modifications as are suited to the particular use contemplated. It is intended that the scope of the teachings include the claims appended hereto.

What is claimed is:

1. A three-dimensional stacked non-volatile memory device, comprising:
   a first memory hole defined as extending vertically at least from a top of and through a stack of alternating word line layers and dielectric layers, the first memory hole having a vertically extending interior coated with a layer of programmable material having a first thickness and with a more interior layer of channel forming material having a second thickness, the channel forming material being one of an undoped semiconductive material and a lightly doped semiconductive material of a first conductivity type;
   a source region disposed at an underneath portion of the channel forming material and having a second conductivity type opposite to said first conductivity type, the underneath portion of the channel forming material being disposed at and extending horizontally parallel with a bottom of the first memory hole; and
   a horizontally extending layer of the programmable material continuing from the programmable material coating the vertically extending interior of the first memory hole and being disposed underneath the alternating word line and dielectric layers.

2. The memory device of claim 1 wherein:
   the programmable material that coats a sidewall of the interior of the first memory hole is one that is not damaged by having been subjected to an etching environment after the programmable material is formed to coat the sidewall of the interior of the first memory hole.

3. The memory device of claim 2 wherein the source region includes a heavily doped semiconductor making contact with the horizontally extending layer of the programmable material.

4. The memory device of claim 1 and further comprising:
   a horizontally extending layer of metal disposed under and making electrical connection with the source region.

5. The memory device of claim 1 wherein:
   the first memory hole is filled at a yet more interior portion of thereof with a dielectric support material, the yet more interior portion being interior of the layer of channel forming material.

6. The memory device of claim 5 wherein:
   the dielectric support material includes a silicon oxide.

7. The memory device of claim 5 wherein:
   the programmable material extends to be disposed at locations below a lowest level of the dielectric support material.

8. The memory device of claim 7 wherein:
   a horizontally extending portion of the channel forming material is interposed between the source region and the dielectric support material.

9. The memory device of claim 5 wherein:
   the horizontally extending portion of the channel forming material underlies the dielectric support material.

10. The memory device of claim 1 and further comprising:
    a horizontally extending layer of heavily doped semiconductor forming part of the source region and making contact with the horizontally extending portion of the channel forming material; and
    a horizontally extending layer of metallic interconnect making contact with the horizontally extending layer of heavily doped semiconductor.

11. The memory device of claim 10 and further comprising:
    a vertically extending layer of metallic interconnect continuing from the horizontally extending layer of metallic interconnect.

12. The memory device of claim 1 and further comprising:
    a horizontally extending layer of heavily doped semiconductor forming part of the source regions and making contact with the horizontally extending portion of the channel forming material; and
    a vertically extending layer of metallic interconnect making contact with the horizontally extending layer of heavily doped semiconductor.

13. The memory device of claim 1 and further comprising:
    a second memory hole defined as extending through the stack of alternating word line layers and dielectric layers, the second memory hole having a respective second interior coated with a respective second layer of the programmable material having the first thickness and with a respective second more interior layer of the channel forming material having the second thickness;
    a second source region disposed at respective second underneath portion of the channel forming material of the second memory hole, the respective second underneath portion being disposed at the bottom of the second memory hole; and a respective second horizontally extending layer of the programmable material continuing from the programmable material coating the interior of the second memory hole and being disposed under the stack of alternating word line and dielectric layers.

14. The memory device of claim 13 wherein:

the second source region of the second memory hole is contiguous with source region of the first memory hole.

15. The memory device of claim 13 and further comprising:

a metal filled source trench extending adjacent to and connected to the second source region of the second memory hole and to the source region of the first memory hole.

16. The memory device of claim 1 and further comprising:

a source region contacting conductor extending from at least a top of the stack, through the stack and further extending to make contact with the source region.

* * * * *